United States Patent
Mayers et al.

(10) Patent No.: US 8,608,972 B2
(45) Date of Patent: Dec. 17, 2013

(54) METHOD FOR PATTERNING A SURFACE

(75) Inventors: Brian T. Mayers, Somerville, MA (US); Jeffrey Carbeck, Belmont, MA (US); Wajeeh Saadi, Cambridge, MA (US); George M. Whitesides, Newton, MA (US); Ralf Kügler, Cambridge, MA (US); Monika Kursawe, Seeheim-Jugenheim (DE); Johannes Canisius, Winchester (GB)

(73) Assignees: Nano Terra Inc., Cambridge, MA (US); Merck Patent GmbH, Darmstadt (DE)

( * ) Notice: Subject to any disclaimer, the term of this patent is extended or adjusted under 35 U.S.C. 154(b) by 874 days.

(21) Appl. No.: 12/483,128

(22) Filed: Jun. 11, 2009

(65) Prior Publication Data

US 2009/0302001 A1    Dec. 10, 2009

Related U.S. Application Data

(63) Continuation-in-part of application No. 11/950,703, filed on Dec. 5, 2007.

(60) Provisional application No. 60/872,802, filed on Dec. 5, 2006.

(51) Int. Cl.
*C03C 25/68* (2006.01)

(52) U.S. Cl.
USPC .......................................................... 216/54

(58) Field of Classification Search
None
See application file for complete search history.

(56) References Cited

U.S. PATENT DOCUMENTS 2,897,066 A    7/1959    Grahm et al.
3,647,508 A    3/1972    Gorrell
3,657,085 A *  4/1972    Hoffmeister et al. .... 204/157.41
3,716,911 A    2/1973    Burtscher et al.
4,021,279 A    5/1977    Hirs
5,296,043 A    3/1994    Kawakami et al.
5,504,015 A    4/1996    Margadonna et al.
5,512,131 A    4/1996    Kumar et al.
5,688,366 A   11/1997    Ichinose et al.
5,725,788 A    3/1998    Maracas et al.
5,772,905 A    6/1998    Chou
5,894,853 A    4/1999    Fujisaki et al.
5,925,259 A    7/1999    Biebuyck et al.
6,047,637 A    4/2000    Chan et al.
6,048,623 A    4/2000    Everhart et al.
6,388,187 B1   5/2002    Takeyama et al.
6,677,174 B2 * 1/2004    Kim et al. ....................... 438/22
6,703,295 B2   3/2004    Meier et al.

(Continued)

FOREIGN PATENT DOCUMENTS

EP    1 708 022 A1    10/2006
EP    1 731 961 A1    12/2006

(Continued)

OTHER PUBLICATIONS

English Language abstract of JP 4142029 (1992) Japanese Patent Abstracts (listed on accompanying PTO/SB/08A as document FP1).
English language abstract of JP 5028852 (1993) Japanese Patent Abstracts (listed on accompanying PTO/SB/08A as document FP2).

(Continued)

*Primary Examiner* — Allan Olsen
(74) *Attorney, Agent, or Firm* — Millen, White, Zelano & Branigan, P.C.

(57) ABSTRACT

The present invention is directed to methods for patterning surfaces using contact printing and pastes, and products formed therefrom.

23 Claims, 13 Drawing Sheets

(56) References Cited

U.S. PATENT DOCUMENTS

| | | | |
|---|---|---|---|
| 6,957,608 | B1 | 10/2005 | Hubert et al. |
| 7,196,018 | B2 | 3/2007 | Szlufcik et al. |
| 2002/0130444 | A1 | 9/2002 | Hougham |
| 2003/0006527 | A1 | 1/2003 | Rabolt et al. |
| 2003/0071016 | A1 | 4/2003 | Shih et al. |
| 2003/0160026 | A1 | 8/2003 | Klein et al. |
| 2004/0013982 | A1 | 1/2004 | Jacobson et al. |
| 2004/0063326 | A1 | 4/2004 | Szlufcik et al. |
| 2004/0110393 | A1 | 6/2004 | Munzer et al. |
| 2005/0115604 | A1 | 6/2005 | Fath et al. |
| 2005/0120902 | A1 | 6/2005 | Adams et al. |
| 2005/0247674 | A1 | 11/2005 | Kubelbeck et al. |
| 2006/0046326 | A1 | 3/2006 | Kok et al. |
| 2006/0105571 | A1 | 5/2006 | Colburn et al. |
| 2006/0110890 | A1 | 5/2006 | Colburn et al. |
| 2006/0249886 | A1 | 11/2006 | Chao et al. |
| 2007/0018345 | A1 | 1/2007 | Chao et al. |
| 2007/0238054 | A1 | 10/2007 | Kok et al. |

FOREIGN PATENT DOCUMENTS

| | | |
|---|---|---|
| JP | 4142029 | 5/1992 |
| JP | 5028852 | 2/1993 |
| JP | 6071853 | 3/1994 |
| JP | 2002086483 | 3/2002 |
| JP | 2004268319 | 9/2004 |
| JP | 2005-353585 A | 12/2005 |
| JP | 2007-055235 A | 3/2007 |
| WO | WO 2005/109095 A2 | 11/2005 |
| WO | WO 2006/070813 A1 | 7/2006 |
| WO | WO 2006/131153 A1 | 12/2006 |
| WO | WO 2007/083087 A1 | 7/2007 |
| WO | WO 2007/085044 | 8/2007 |

OTHER PUBLICATIONS

English language abstract of JP 6071853 (1994) Japanese Patent Abstracts (listed on accompanying PTO/SB/08A as document FP3).
English language abstract of JP 2004268319 (2004) Japanese Patent Abstracts (listed on accompanying PTO/SB/08A as document FP4).
English language abstract of JP 2002086483 (2002) Japanese Patent Abstracts (listed on accompanying PTO/SB/08A as Document FP7).
Kim, Y.S, et al., "Fabrication of three-dimensional microstructures by soft molding," *Appl. Phys. Lett.* 79:2285-2287 (2001) American Institute of Physics.
Nakamatsu, K. et al., "Nanoimprinting Using Liquid-Phase Hydrogen Silsequioxane," *Jpn. J. Appl. Phys.* 45:L546-L548 (2006) published on-line May 26, 2006.
Xia, Y. and Whitesides, G. M., "Soft Lithography," *Agnew. Chem. Int. Ed.* 37:550-575 (1998) Wiley-VCH Verlag GmbH, Weinheim.
International Search Report cited in Application No. PCT/US2007/024854, dated Aug. 21, 2008.
Colburn, M. et al., "Step and Flash Imprint Lithography: A New Approach to High-Resolution Patterning," *Proc SPIE* 3676:379-389, The International Society for Optical Engineering, Bellingham, WA (1999).
Office Action from U.S. Appl. No. 11/950,703, filed Dec. 5, 2007, inventors: Mayers et al., U.S. Patent and Trademark Office, Alexandria, VA, mailed Oct. 12, 2010.
Office Action from U.S. Appl. No. 11/950,703, filed Dec. 5, 2007, inventors: Mayers et al., U.S. Patent and Trademark Office, Alexandria, VA, mailed Mar. 25, 2011.
Japanese Office Action in corresponding Japanese Application No. JP 2009-540265, mailed Apr. 9, 2012.
English language translation of Japanese Office Action in corresponding Japanese Application No. JP 2009-540265, mailed Apr. 9, 2012.

* cited by examiner

METHOD FOR PATTERNING A SURFACE

CROSS REFERENCE TO RELATED APPLICATIONS

This application is a Continuation-In-Part of U.S. patent application Ser. No. 11/950,703, filed Dec. 5, 2007, which claims the benefit of the filing date of U.S. Patent Application No. 60/872,802, filed Dec. 5, 2006, both of which are incorporated herein by reference in their entirety.

BACKGROUND OF THE INVENTION

1. Field of the Invention

The present invention is directed to methods for patterning a surface using contact printing processes that employ a stamp or an elastomeric stencil and a paste.

2. Background

Traditional photolithography methods, while versatile in the architectures and compositions of surface features that can be formed, are also costly and require specialized equipment. Moreover, photolithography techniques have difficulty patterning very large and/or non-rigid surfaces such as, for example, textiles, paper, plastics, and the like. Contact printing methods such as microcontact printing, (see, e.g., U.S. Pat. No. 5,512,131), microcontact molding (see, e.g., U.S. Pat. No. 5,925,259), micromolding in capillaries (see, e.g., U.S. Pat. No. 6,355,198), and the like have been used to pattern a wide variety of substrates, including non-planar and plastic substrates.

Pastes are used frequently to pattern a variety of substrates for applications in which sub-50 μm resolution is not required. Typically, a paste is applied to a substrate by screen printing, spraying, ink-jet printing, or syringe deposition. In particular, pastes comprising an etchant have been used to pattern various metal oxides using screen-printing methods. For example, conductive oxides for display applications can be patterned using an etch paste comprising phosphoric acid or a mixture of iron chloride and nitric acid. Feature sizes of about 50 μm are achievable using a stainless steel screen having a mesh count of about 350 to about 500. However, screen printing has difficulty patterning surface features having a lateral dimension below 50 μm, and can have difficulty patterning features on non-planar substrates. Furthermore, screen printing methods can have difficulty patterning both small- and large-dimension features using the same screen and paste composition.

BRIEF SUMMARY OF THE INVENTION

What is needed is a contact printing method that can achieve lateral dimensions of about 50 μm or less on a wide range of substrates, including both planar and non-planar substrates. The method should be low-cost, highly reproducible and scalable. In particular, the method of the present invention can produce features having at least one lateral dimension of about 50 μm or less while at the same time forming features having much larger lateral dimensions.

The present invention is directed to patterning substrates using contact-printing techniques that employ pastes and other compositions as inks for forming features on the substrates. Surface features formed by the method of the present invention can have at least one lateral dimension of about 50 μm or less, and permit all varieties of surfaces to be patterned in a cost-effective, efficient, and reproducible manner.

The present invention is directed to a method for etching a feature into a substrate, the method comprising:

(a) providing a stamp having a surface including at least one indentation therein, the at least one indentation being contiguous with and defining a pattern in the surface of the stamp, wherein the surface and the at least one indentation are hydrophilic;

(b) applying an etch paste to the surface and the at least one indentation of the stamp to provide a coated stamp;

(c) conformally contacting the surface of the coated stamp with a substrate;

(d) applying pressure to a backside of the stamp to isolate the etch paste on an area of the substrate adjacent to the at least one indentation and substantially remove etch paste from between the surface of the stamp and the substrate; and (e) reacting the etch paste for a period of time sufficient to etch a feature into the substrate having at least one lateral dimension of about 500 nm to about 50 μm, wherein the reacting is isolated on an area of the substrate adjacent to the at least one indentation.

The present invention is also directed to a method for etching a feature into a substrate, the method comprising:

(a) applying an etch paste to a substrate to form a coated substrate;

(b) providing a stamp having a surface including at least one indentation therein, the at least one indentation being contiguous with and defining a pattern in the surface of the stamp, wherein the surface and the at least one indentation are hydrophilic;

(c) conformally contacting the surface of the coated stamp with a substrate;

(d) applying pressure to a backside of the stamp to isolate the etch paste on an area of the substrate adjacent to the at least one indentation and substantially remove etch paste from between the surface of the stamp and the substrate; and (e) reacting the etch paste for a period of time sufficient to etch a feature into the substrate having at least one lateral dimension of about 500 nm to about 50 μm, wherein the reacting is isolated on an area of the substrate adjacent to the at least one indentation.

In some embodiments, a method further comprises substantially uniformly pre-treating the stamp with an oxygen plasma to provide the stamp having a hydrophilic surface and indentation.

In some embodiments, a method of the present invention further comprises initiating a reaction between the etch paste and the substrate. In some embodiments, the initiating comprises increasing the temperature of at least one of the substrate, the stamp, and the etch paste. In some embodiments, the initiating comprises increasing a temperature of at least one of the stamp, the etch paste, the substrate, or combinations thereof by about 20° C. to about 400° C.

In some embodiments, the providing comprises a stamp that includes at least one indentation having a surface area of greater than 1 mm$^2$ and having a channel fluidly connecting the at least one indentation with a back surface of the stamp, wherein the channel is suitable for dissipating a trapped gas or excess etch paste from the at least one indentation.

In some embodiments, the providing includes a stamp having a surface area of about 40,000 mm$^2$ or greater.

In some embodiments, the uniformly applying includes an etch paste comprising phosphoric acid and having a viscosity of about 80 cP to about 500 cP.

In some embodiments, the applying an etch paste comprises substantially uniformly applying the etch paste to the substrate.

In some embodiments, the applying an etch paste comprises applying the etch paste to an edge of the substrate, and wherein the conformally contacting comprises contacting the stamp first with an edge of the substrate having the etch paste thereon and gradually increasing the contact area between the stamp and the substrate until the entire stamp surface conformally contacts the substrate.

In some embodiments, the applying pressure comprises substantially evenly applying about 50 kPa to about 300 kPa to the backside of the stamp.

In some embodiments, the reacting is for a period of time sufficient to etch a feature into the substrate having at least one lateral dimension of about 1 µm to about 25 µm. In some embodiments, the reacting is for a period of time sufficient to etch a feature into the substrate having at least one lateral dimension of about 1 µm to about 25 µm and etch another feature into the substrate having at least one lateral dimension of about 100 µm or greater.

In some embodiments, the conformally contacting comprises a substrate that includes a layer of indium tin oxide.

In some embodiments, a method further comprises after reacting the etch paste, removing the stamp from the substrate. In some embodiments, a method further comprises after reacting the etch paste, cleaning the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1A:
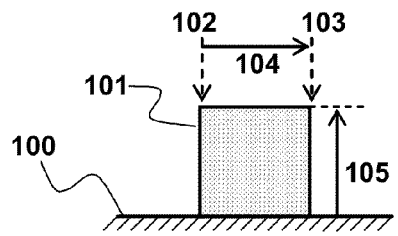
FIGS. 1A, 1B, 1C, 1D, 1E, 1F, 1G and 1H provide schematic cross-sectional representations of surface features prepared by a method of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

References to spatial descriptions (e.g., "above", "below", "up", "down", "top", "bottom," etc.) made herein are for purposes of description and illustration only, and should be interpreted as non-limiting upon the stamps, substrates, coatings, methods, and products of any method of the present invention, which can be spatially arranged in any orientation or manner.

Surface Features

The present invention provides methods for forming a feature in or on a substrate. Substrates suitable for use with the present invention are not particularly limited by size, composition or geometry. For example, the present invention is suitable for patterning planar, curved, symmetric, and asymmetric objects and surfaces, and any combination thereof. Additionally, the substrate can be homogeneous or heterogeneous in composition. The methods are also not limited by surface roughness or surface waviness, and are equally applicable to smooth, rough and wavy surfaces, and substrates exhibiting heterogeneous surface morphology (i.e., substrates having varying degrees of smoothness, roughness and/or waviness).

As used herein, a "feature" refers to an area of a substrate that is contiguous with, and can be distinguished from, the areas of the substrate surrounding the feature. For example, a feature can be distinguished from the areas of the substrate surrounding the feature based upon the topography of the feature, composition of the feature, or another property of the surface feature that differs from the areas of the substrate surrounding the feature.

Features are defined by their physical dimensions. All features have at least one lateral dimension. As used herein, a "lateral dimension" refers to a dimension of a feature that lies in the plane of a surface. One or more lateral dimensions of a feature define, or can be used to define, the surface area of a substrate that a feature occupies. Typical lateral dimensions of features include, but are not limited to: length, width, radius, diameter, and combinations thereof.

All features have at least one dimension that can be described by a vector that lies out of the plane of a surface. As used herein, "elevation" refers to the largest vertical distance between the plane of a surface and the highest or lowest point on a surface feature. More generally, the elevation of an additive surface feature refers to its highest point relative to a plane of a substrate, the elevation of a subtractive surface feature refers to its lowest point relative to the plane of a substrate, and a conformal surface feature has an elevation of zero (i.e., is at the same height as the plane of the substrate).

A surface feature produced by a method of the present invention can generally be classified as: an additive feature, a conformal feature, or a subtractive feature, based upon the elevation of the surface feature relative to a plane of the substrate.

A surface feature produced by a method of the present invention can be further classified as: a penetrating surface feature or a non-penetrating surface feature, based upon whether or not the base of a surface feature penetrates below the plane of a substrate on which it is formed. As used herein, a "penetration distance" refers to the distance between the lowest point of a surface feature and the height of the substrate adjacent to the surface feature. More generally, the penetration distance of a surface feature refers to its lowest point relative to the plane of the substrate. Thus, a feature is said to be "penetrating" when its lowest point is located below the plane of the substrate on which the feature is located, and a feature is said to be "non-penetrating" when the lowest point of the feature is located within or above the plane of the substrate on which it is located. A non-penetrating surface feature can be said to have a penetration distance of zero.

Figure 1B:
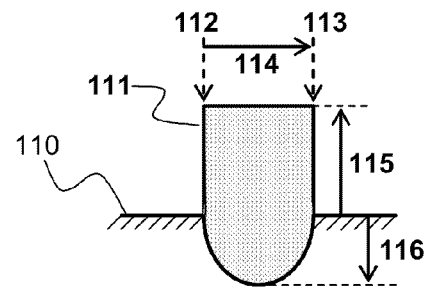

As used herein, an "additive feature" refers to a surface feature having an elevation that is above the plane of a substrate. Thus, the elevation of an additive feature is greater than the elevation of the surrounding substrate. FIG. 1A shows a cross-sectional schematic representation of a substrate, 100, having an "additive non-penetrating" surface feature, 101. The surface feature, 101, has a lateral dimension, 104, an elevation, 105, and a penetration distance of zero. FIG. 1B shows a cross-sectional schematic representation of a substrate, 110, having an "additive penetrating" surface feature, 111. The surface feature, 111, has a lateral dimension, 114, an elevation, 115, and a penetration distance, 116.

Figure 1C:
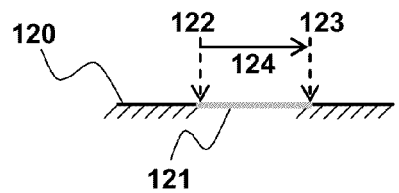
Figure 1D:
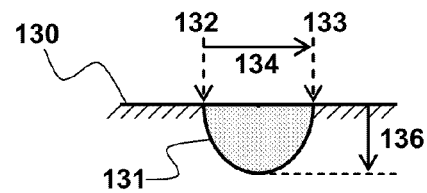
Figure 1E:
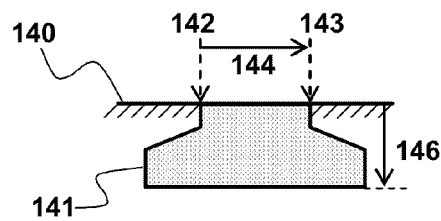

As used herein, a "conformal feature" refers to a surface feature having an elevation that is even with a plane of the substrate on which the feature is located. Thus, a conformal feature has substantially the same topography as the surrounding substrate. As used herein, a "conformal non-penetrating" surface feature refers to a surface feature that is purely on the surface of a substrate. For example, a paste that reacts with the exposed functional groups of a substrate such as, for example, by oxidizing, reducing, or functionalizing the substrate, would form a conformal non-penetrating surface feature. FIG. 1C shows a cross-sectional schematic representation of a substrate, 120, having a "conformal non-penetrating" surface feature, 121. The surface feature, 121, has a lateral dimension, 124, and has an elevation of zero and a penetration distance of zero. FIG. 1D shows a cross-sectional schematic representation of a substrate, 130, having a "conformal penetrating" surface feature, 131. The surface feature, 131, has a lateral dimension, 134, an elevation of zero, and penetration distance, 136. FIG. 1E shows a cross-sectional schematic representation of a substrate, 140, having a "conformal penetrating" surface feature, 141. The surface feature, 141, has a lateral dimension, 144, an elevation of zero, and penetration distance, 146.

Figure 1F:
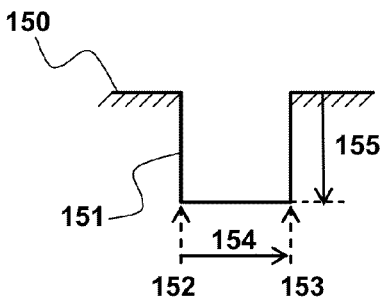
Figure 1G:
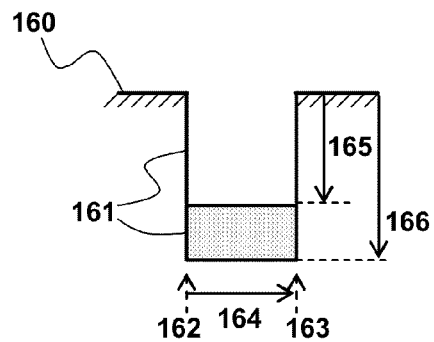
Figure 1H:
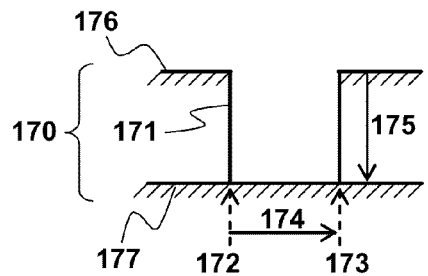

As used herein, a "subtractive feature" refers to a surface feature having an elevation that is below the plane of the surface. FIG. 1F shows a cross-sectional schematic representation of a substrate, 150, having a "subtractive non-penetrating" surface feature, 151. The surface feature, 151, has a lateral dimension, 154, an elevation, 155, and penetration distance of zero. FIG. 1G shows a cross-sectional schematic representation of a substrate, 160, having a "subtractive penetrating" surface feature, 161. The surface feature, 161, has a lateral dimension, 164, an elevation, 165, and a penetration distance, 166. FIG. 1H shows a cross-sectional schematic representation of a laminate or bilayer substrate, 170, that includes an upper layer or surface layer, 176, and an underlayer, 177. The substrate includes a "subtractive non-penetrating" surface feature, 171. The surface feature, 171, has a lateral dimension, 174, and an elevation, 175.

Surface features can be further differentiated based upon their composition and utility. For example, surface features produced by a method of the present invention include structural surface features, conductive surface features, semi-conductive surface features, insulating surface features, and masking surface features.

As used herein, a "structural feature" refers to surface feature having a composition similar or identical to the composition of the substrate on which the surface feature is located.

As used herein, a "conductive feature" refers to a surface feature having a composition that is electrically conductive, or electrically semi-conductive. Electrically semi-conductive features include surface features whose electrical conductivity can be modified based upon an external stimulus such as, but not limited to, an electrical field, a magnetic field, a temperature change, a pressure change, exposure to radiation, and combinations thereof.

As used herein, an "insulating feature" refers to a surface feature having a composition that is electrically insulating.

As used herein, a "masking feature" refers to a surface feature that has composition that is inert to reaction with a reagent that is reactive towards an area of the substrate adjacent to and surrounding the surface feature. Thus, a masking feature can be used to protect an area of a substrate during subsequent process steps, such as, but not limited to, etching, deposition, implantation, and surface treatment steps. In some embodiments, a masking feature is removed during or after subsequent process steps.

Feature Size and Measurement

A surface feature produced by a method of the present invention has lateral and vertical dimensions that are typically defined in units of length, such as angstroms (Å), nanometers (nm), microns (µm), millimeters (mm), centimeters (cm), etc.

When an area of the surface of a substrate surrounding a feature thereon is planar, a lateral dimension of a surface feature can be determined by the magnitude of a vector between two points located on opposite sides of a surface feature, wherein the two points are in the plane of the substrate and wherein the vector is parallel to the plane of the substrate. In some embodiments, two points used to determine a lateral dimension of a symmetric surface feature also lie on a mirror plane of the symmetric feature. In some embodiments, a lateral dimension of an asymmetric surface feature can be determined by aligning a vector orthogonally to at least one edge of the surface feature.

For example, in FIGS. 1A-1H points lying in the plane of the substrate and on opposite sides of the surface features, 101, 111, 121, 131, 141, 151, 161 and 171, are shown by dashed arrows, 102 and 103; 112 and 113; 122 and 123; 132 and 133; 142 and 143; 152 and 153, 162 and 163, and 172 and 173, respectively. The lateral dimension of these surface features is shown by the magnitude of the vectors 104, 114, 124, 134, 144, 154, 164, and 174, respectively.

A surface of a substrate is "curved" when the radius of curvature of a substrate surface is non-zero over a distance on the surface of the substrate of 100 µm or more, or over a distance on the surface of the substrate of 1 mm or more. For a curved substrate, a lateral dimension is defined as the magnitude of a segment of the circumference of a circle connecting two points on opposite sides of the surface feature, wherein the circle has a radius equal to the radius of curvature of the substrate. A lateral dimension of a substrate having a curved surface having multiple or undulating curvature, or waviness, can be determined by summing the magnitude of segments from multiple circles.

Figure 2:
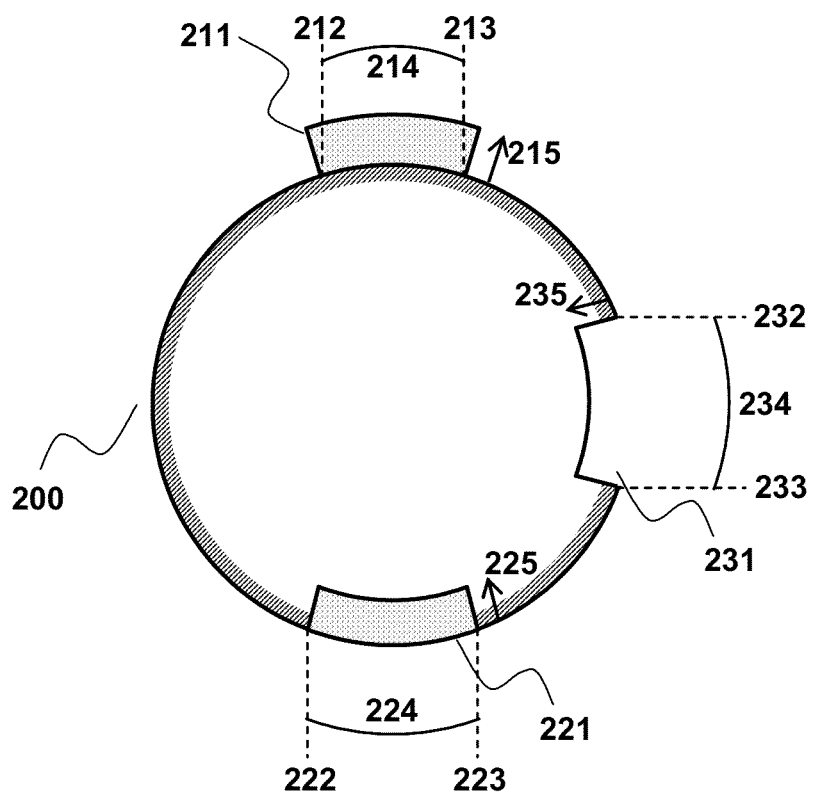
FIG. 2 provides a schematic cross-sectional representation of a curved substrate having features thereon prepared by a method of the present invention.

FIG. 2 displays a cross-sectional schematic of a substrate having a curved surface, 200, having an additive non-penetrating surface feature, 211, a conformal penetrating surface feature, 221, and a subtractive non-penetrating surface feature, 231. Referring to FIG. 2, a lateral dimension of the additive non-penetrating surface feature, 211, is equivalent to the length of the line segment, 214, which can connect points 212 and 213. A lateral dimension of the conformal penetrating surface feature, 221, is equivalent to the length of the line segment, 224, which connect points 222 and 223. A lateral dimension of the subtractive non-penetrating surface feature, 231, is equivalent to the length of the line segment, 234, which connect points 232 and 233. The surface feature 211 has an elevation equivalent to the magnitude of vector 215 and a penetration distance of zero. The surface feature 221 has an elevation of zero and a penetration distance equivalent to the magnitude of vector 225. Finally, surface feature 231 has an elevation equivalent to the magnitude of vector 235 and a penetration distance of zero.

In some embodiments, a surface feature produced by a method of the present invention has at least one lateral dimension of about 500 nm to about 50 µm. In some embodiments, a surface feature produced by a method of the present invention has at least one lateral dimension having a minimum size of about 500 nm, about 600 nm, about 700 nm, about 800 nm, about 900 nm, about 1 µm, about 2 µm, about 3 µm, about 4 µm, about 5 µm, about 10 µm, about 15 µm, about 20 µm, about 25 µm, about 30 µm, about 40 µm, or about 50 µm. In some embodiments, a surface feature produced by a method of the present invention has at least one lateral dimension having a maximum size of about 100 µm, about 90 µm, about 80 µm, about 70 µm, about 60 µm, about 50 µm, about 40 µm, about 35 µm, about 30 µm, about 25 µm, about 20 µm, about 15 µm, about 10 µm, about 5 µm, about 2 µm, or about 1 µm.

In some embodiments, a surface feature produced by a method of the present invention has at least one lateral dimension of about 500 nm to about 50 µm, about 500 nm to about 40 µm, about 500 nm to about 30 µm, about 500 nm to about 25 µm, about 500 nm to about 20 µm, about 500 nm to about 15 µm, about 500 nm to about 10 µm, about 500 nm to about 7.5 µm, about 500 nm to about 5 µm, about 500 nm to about 2.5 µm, about 1 µm to about 50 µm, about 1 µm to about 40 µm, about 1 µm to about 30 µm, about 1 µm to about 25 µm, about 1 µm to about 20 µm, about 1 µm to about 15 µm, about 1 µm to about 10 µm, about 1 µm to about 7.5 µm, about 1 µm to about 5 µm, about 1 µm to about 2.5 µm, about 2.5 µm to about 50 µm, about 2.5 µm to about 40 µm, about 2.5 µm to about 30 µm, about 2.5 µm to about 25 µm, about 2.5 µm to about 20 µm, about 2.5 µm to about 15 µm, about 2.5 µm to about 10 µm, about 2.5 µm to about 7.5 µm, about 2.5 µm to about 5 µm, about 5 µm to about 50 µm, about 5 µm to about 40 µm, about 5 µm to about 30 µm, about 5 µm to about 25 µm, about 5 µm to about 20 µm, about 5 µm to about 15 µm, about 5 µm to about 10 µm, about 10 µm to about 50 µm, about 10 µm to about 40 µm, about 10 µm to about 30 µm, about 10 µm to about 25 µm, about 10 µm to about 20 µm, about 10 µm to about 15 µm, about 20 µm to about 50 µm, about 20 µm to about 40 µm, about 20 µm to about 30 µm, about 20 µm to about 25 µm, about 25 µm to about 50 µm, about 30 µm to about 50 µm, or about 40 µm to about 50 µm.

In some embodiments, a pattern provided by a method of the present invention comprises a first feature having at least one lateral dimension of about 1 µm to about 25 µm and a second feature having at least one lateral dimension of about 100 µm or greater, about 125 µm or greater, about 150 µm or greater, about 175 µm or greater, about 200 µm or greater, about 250 µm or greater, about 300 µm or greater, about 350 µm or greater, about 400 µm or greater, about 450 µm or greater, or about 500 µm or greater.

In some embodiments, a feature produced by a method of the present invention has an elevation or penetration distance of about 3 Å to about 100 µm. In some embodiments, a surface feature produced by a method of the present invention has a minimum elevation or penetration distance of about 3 Å, about 5 Å, about 8 Å, about 1 nm, about 2 nm, about 5 nm, about 10 nm, about 15 nm, about 20 nm, about 30 nm, about 50 nm, about 100 nm, about 500 nm, about 1 µm, about 2 µm, about 5 µm, about 10 µm, or about 20 µm above or below the plane of a surface. In some embodiments, a surface feature produced by a method of the present invention has a maximum elevation or penetration distance of about 100 µm, about 90 µm, about 80 µm, about 70 µm, about 60 µm, about 50 µm, about 40 µm, about 30 µm, about 20 µm, about 10 µm, or about 5 µm above or below the plane of a surface.

In some embodiments, a surface feature produced by a method of the present invention has an aspect ratio (i.e., a ratio of either one or both of the elevation and/or penetration distance to a lateral dimension) of about 1,000:1 to about 1:100,000, about 100:1 to about 1:100, about 80:1 to about 1:80, about 50:1 to about 1:50, about 20:1 to about 1:20, about 15:1 to about 1:15, about 10:1 to about 1:10, about 8:1 to about 1:8, about 5:1 to about 1:5, about 2:1 to about 1:2, or about 1:1.

In some embodiments, a surface feature has a surface area of about 1 µm$^2$ or more, about 10 µm$^2$ or more, about 100 µm$^2$ or more, about 1,000 µm$^2$ or more, about 10,000 µm$^2$ or more, about 100,000 µm$^2$ or higher, about 1 mm$^2$ or higher, about 10 mm$^2$ or higher, or about 100 mm$^2$ or higher.

As used herein, "large-area" surface features have an area of about 1 mm$^2$ or higher. In some embodiments, the present invention is particularly suited for providing large-area surface features (i.e., surface features having an area of about 1 mm$^2$ or greater) by providing a stamp that includes at least one indentation having a surface area of greater than 1 mm$^2$ and having a channel fluidly connecting the at least one indentation with a back surface of the stamp, wherein the channel is suitable for dissipating a trapped gas or excess etch paste from the at least one indentation. A channel provides a means for gases and/or excess paste to be removed from the volume defined by the at least one indentation and a substrate to provide uniform and reproducible patterning.

A lateral and/or vertical dimension of an additive or subtractive surface feature can be determined using an analytical method that can measure surface topography such as, for example, scanning mode atomic force microscopy ("AFM")

or profilometry. Conformal surface features cannot typically be detected by profilometry methods. However, if the surface of a conformal surface feature is terminated with a functional group whose polarity differs from that of the surrounding surface areas, a lateral dimension of the surface feature can be determined using, for example, tapping mode AFM, functionalized AFM, or scanning probe microscopy.

Surface features can also be identified based upon a property such as, but not limited to, conductivity, resistivity, density, permeability, porosity, hardness, and combinations thereof using, for example, scanning probe microscopy.

In some embodiments, a surface feature can be differentiated from the surrounding surface area using, for example, scanning electron microscopy or transmission electron microscopy.

In some embodiments, a surface feature has a different composition or morphology compared to the surrounding surface area. Thus, surface analytical methods can be employed to determine both the composition of the surface feature, as well as the lateral dimension of the surface feature. Analytical methods suitable for determining the composition and lateral and vertical dimensions of a surface feature include, but are not limited to, Auger electron spectroscopy, energy dispersive x-ray spectroscopy, micro-Fourier transform infrared spectroscopy, particle induced x-ray emission, Raman spectroscopy, x-ray diffraction, x-ray fluorescence, laser ablation inductively coupled plasma mass spectrometry, Rutherford backscattering spectrometry/Hydrogen forward scattering, secondary ion mass spectrometry, time-of-flight secondary ion mass spectrometry, x-ray photoelectron spectroscopy, and combinations thereof.

Paste Compositions

As used herein, a "paste" refers to a heterogeneous composition having a viscosity of about 1 centiPoise (cP) to about 10,000 cP. A "heterogeneous composition" refers to a composition having more than one excipient or component. As used herein, "paste" can also refer to a gel, a cream, a glue, an adhesive, and any other viscous liquid or semi-solid. In some embodiments, a paste for use with the present invention has a tunable viscosity, and/or a viscosity that can be controlled by one or more external conditions.

In some embodiments, a paste for use with the present invention has a viscosity of about 1 cP to about 10,000 cP. In some embodiments, a paste for use with the present invention has a minimum viscosity of about 1 cP, about 2 cP, about 5 cP, about 10 cP, about 15 cP, about 20 cP, about 25 cP, about 30 cP, about 40 cP, about 50 cP, about 60 cP, about 75 cP, about 100 cP, about 125 cP, about 150 cP, about 175 cP, about 200 cP, about 250 cP, about 300 cP, about 400 cP, about 500 cP, about 750 cP, about 1,000 cP, about 1,250 cP, about 1,500 cP, or about 2,000 cP. In some embodiments, a paste for use with the present invention has a maximum viscosity of about 10,000 cP, about 9,500 cP, about 9,000 cP, about 8,500 cP, about 8,000 cP, about 7,500 cP, about 7,000 cP, about 6,500 cP, about 6,000 cP, about 5,500 cP, about 5,000 cP, about 4,000 cP, about 3,000 cP, about 2,000 cP, about 1,000 cP, about 500 cP, about 250 cP, about 100 cP, or about 50 cP.

In some preferred embodiments, a paste has a viscosity of about 80 cP to about 500 cP, about 80 cP to about 450 cP, about 80 cP to about 400 cP, about 80 cP to about 300 cP, about 80 cP to about 250 cP, about 80 cP to about 200 cP, about 80 cP to about 150 cP, about 100 cP to about 500 cP, about 100 cP to about 400 cP, about 100 cP to about 300 cP, about 100 cP to about 250 cP, about 200 cP to about 500 cP, about 200 cP to about 400 cP, about 250 cP to about 500 cP, about 300 cP to about 500 cP, or about 400 cP to about 500 cP.

Typically, the viscosity of a paste is controlled. Parameters that can control viscosity of a paste include, but are not limited to, the average length, molecular weight, and/or degree of cross-linking of a copolymer; as well as the presence of a solvent and a concentration of a solvent; the presence of the a thickener (i.e., a viscosity-modifying component) and a concentration of a thickener; a particle size of a component present in the paste; the free volume (i.e., porosity) of a component present in the paste; the swellability of a component present in the paste; an ionic interaction between oppositely charged and/or partially charged species present in the paste (e.g., a solvent-thickener interaction); and combinations thereof.

In some embodiments, a paste suitable for use with the present invention comprises a solvent and a thickening agent. In some embodiments, the combination of a solvent and a thickening agent can be selected to adjust the viscosity of a paste. Not being bound by any particular theory, the viscosity of a paste can be an important parameter for producing surface features having a desired lateral dimension.

Thickening agents suitable for use with a paste of the present invention include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide and polypropylene oxide), agar, agarose, xanthan gums, gelatin, dendrimers, colloidal silicon dioxide, and combinations thereof. In some embodiments, a thickener is present in a paste in a concentration of about 0.1% to about 50%, about 0.5% to about 25%, about 1% to about 20%, or about 5% to about 15% by weight of the paste.

In some embodiments, a paste further comprises a solvent. Solvents suitable for use in a paste of the present invention include, but are not limited to, water, $C_1$-$C_8$ alcohols (e.g., methanol, ethanol, propanol and butanol), $C_6$-$C_{12}$ straight chain, branched and cyclic hydrocarbons (e.g., hexane and cyclohexane), $C_6$-$C_{14}$ aryl and aralkyl hydrocarbons (e.g., benzene and toluene), $C_3$-$C_{10}$ alkyl ketones (e.g., acetone), $C_3$-$C_{10}$ esters (e.g., ethyl acetate), $C_4$-$C_{10}$ alkyl ethers, and combinations thereof. In some embodiments, a solvent is present in a paste in a concentration of about 10% to about 99% by weight. In some embodiments, a solvent is present in a paste in a maximum concentration of about 99%, about 98%, about 97%, about 95%, about 90%, about 80%, about 70%, about 60%, about 50%, about 40%, or about 30% by weight of the paste. In some embodiments, a solvent is present in a minimum concentration of about 15%, about 20%, about 25%, about 30%, about 40%, about 50%, about 60%, about 70%, or about 80% by weight of the paste.

In some embodiments, a paste further comprises a surfactant. A surfactant present in a paste can modify the surface energy of a stamp and/or substrate to which the paste is applied, thereby improving the wetting of a surface by the paste. Surfactants suitable for use with the present invention include, but are not limited to, fluorocarbon surfactants that include an aliphatic fluorocarbon group (e.g., ZONYL® FSA and FSN fluorosurfactants, E.I. Du Pont de Nemours and Co., Wilmington, Del.), fluorinated alkyl alkoxylates (e.g., FLUORAD® surfactants, Minnesota Mining and Manufacturing Co., St. Paul, Minn.), hydrocarbon surfactants that have an aliphatic group (e.g., alkylphenol ethoxylates comprising an alkyl group having about 6 to about 12 carbon atoms, such as octylphenol ethoxylate, available as TRITON® X-100, Union Carbide, Danbury, Conn.), silicone surfactants such as silanes and siloxanes (e.g., polyoxyethylene-modified polydimethylsiloxanes such as Dow Corning® Q2-5211 and Q2-5212, Dow Corning Corp., Midland, Mich.), fluorinated silicone surfactants (e.g., fluorinated polysilanes such as Levelene® 100, Ecology Chemical Co., Watertown Mass.), and combinations thereof.

In some embodiments, a paste of the present invention further comprises an etchant. As used herein, an "etchant" refers to a component that can react with a substrate to remove a portion of the substrate. Thus, an etchant is used to form a subtractive feature, and in reacting with a substrate, forms at least one of a volatile material that can diffuse away from the substrate, or a residue, particulate, or fragment that can be removed from the substrate by, for example, a rinsing or cleaning process. In some embodiments, an etchant is present in a paste in a concentration of about 2% to about 80%, about 5% to about 75%, or about 10% to about 75% by weight of the paste.

The composition and/or morphology of a substrate that can react with an etchant is not particularly limited. Subtractive features formed by reacting an etchant with a substrate are also not particularly limited so long as the material that reacts with the etchant can be removed from the resulting subtractive surface feature. Not being bound by any particular theory, an etchant can remove material from a surface by reacting with the substrate to form a volatile product, a residue, a particulate, or a fragment that can, for example, be removed from the substrate by a rinsing or cleaning process. For example, in some embodiments an etchant can react with a metal or metal oxide surface to form a volatile fluorinated metal species. In some embodiments, an etchant can react with a substrate to form an ionic species that is water soluble. Additional processes suitable for removing a residue or particulate formed by reaction of an etchant with a surface are disclosed in U.S. Pat. No. 5,894,853, which is incorporated herein by reference in its entirety.

Etchants suitable for use with the present invention include, but are not limited to, an acidic etchant, a basic etchant, a fluoride-based etchant, and combinations thereof. Etchants for various materials are well known in the chemical arts.

Acidic etchants suitable for use with the present invention include, but are not limited to, nitric acid, sulfuric acid, trifluoromethanesulfonic acid, fluorosulfonic acid, trifluoroacetic acid, hydrofluoric acid, hydrochloric acid, hydrobromic acid, carborane acid, and combinations thereof.

Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof.

Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

In some embodiments, an etch paste further comprises a metal salt such as, but not limited to, transition metal salts (e.g., ferric chloride, ferrous chloride, cuprous chloride, cupric chloride, and the like), an alkali metal salt (e.g., NaCl, NaBr, and the like), an alkaline earth metal salt (e.g., magnesium chloride, and the like), and the like, and combinations thereof.

Etch pastes suitable for use with the present invention include, but are not limited to, HiperEtch® and SolarEtch® (Merck KGaA, Darmstadt, Germany). Additional paste compositions containing an etchant that are suitable for use with the present invention are disclosed in U.S. Pat. Nos. 5,688,366 and 6,388,187; and U.S. Patent Appl. Pub. Nos. 2003/0160026; 2004/0063326; 2004/0110393; and 2005/0247674, which are herein incorporated by reference in their entirety.

In some embodiments, a paste further comprises a reactive component. As used herein, a "reactive component" refers to a compound or species that has a chemical interaction with a substrate. In some embodiments, a reactive compound penetrates or diffuses into a substrate from a surface of the substrate. In some embodiments, a reactive component transforms, binds, or promotes binding to exposed functional groups on the surface of a substrate. Reactive components can include, but are not limited to, ions, free radicals, metals, acids, bases, metal salts, organic reagents, and combinations thereof. In some embodiments, a reactive component is present in a paste in a concentration of about 1% to about 100% by weight of the paste.

In some embodiments, a paste further comprises a conductive component. As used herein, a "conductive component" refers to a compound or species that can transfer or move electrical charge. Conductive components suitable for use with the present invention include, but are not limited to, a metal, a nanoparticle, a polymer, a cream solder, a resin, and combinations thereof. In some embodiments, a conductive component is present in a paste in a concentration of about 1% to about 90% by weight.

Metals suitable for use with the present invention include, but are not limited to, a transition metal, aluminum, silicon, phosphorous, gallium, germanium, indium, tin, antimony, lead, bismuth, alloys thereof, and combinations thereof. In some embodiments, a metal is present as a nanoparticle (i.e., a particle having a diameter of 100 nm or less, or about 0.5 nm to about 100 nm). Nanoparticles suitable for use with the present invention can be homogeneous, multilayered, functionalized, and combinations thereof.

Conductive polymers suitable for use with the present invention include, but are not limited to, an arylene vinylene polymer, a polyphenylenevinylene, a polyacetylene, a polythiophene, a polyimidazole, and combinations thereof.

Pastes comprising conductive components suitable for use with the present invention are further disclosed in U.S. Pat. Nos. 5,504,015; 5,296,043; and 6,703,295 and U.S. Patent Appl. Pub. No. 2005/0115604, which are incorporated herein by reference in their entirety.

In some embodiments, a paste further comprises an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use with the present invention include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, and combinations thereof. In some embodiments, an insulating component is present in a paste in a concentration of about 1% to about 80% by weight.

In some embodiments, a paste further comprises a masking component. As used herein, a "masking component" refers to a compound or species that upon reacting forms a surface feature resistant to a species capable of reacting with the surrounding substrate.

Masking components suitable for use with the present invention include materials commonly employed in traditional photolithography methods as "resists" (e.g., photoresists). Masking components suitable for use with the present invention include, but are not limited to, cross-linked aromatic and aliphatic polymers, non-conjugated aromatic polymers and copolymers, polyethers, polyesters, copolymers of $C_1$-$C_8$ alkyl methacrylates and acrylic acid, copolymers of paralyne, and combinations thereof. In some embodiments, a masking component is present in a paste in a concentration of about 5% to about 98% by weight of the paste.

In some embodiments, a paste comprises a conductive component and a reactive component. For example, a reactive component present in the paste can promote at least one of: penetration of a conductive component into a substrate, reaction between the conductive component and a substrate, adhesion between a conductive feature and a substrate, promoting electrical contact between a conductive feature and a substrate, and combinations thereof. Surface features formed by reacting this paste composition include conductive features chosen from: additive non-penetrating, additive penetrating, subtractive penetrating, and conformal penetrating surface features.

In some embodiments, a paste comprises an etchant and a conductive component, for example, that can be used to produce a subtractive surface feature having a conductive feature inset therein.

In some embodiments, a paste comprises an insulating component and a reactive component. For example, a reactive component present in the paste can promote at least one of: penetration of an insulating component into a substrate, reaction between the insulating component and a substrate, adhesion between an insulating feature and a substrate, promoting electrical contact between an insulating feature and a substrate, and combinations thereof. Surface features formed by reacting this paste composition include insulating features chosen from: additive non-penetrating, additive penetrating, subtractive penetrating, and conformal penetrating surface features.

In some embodiments, a paste comprises an etchant and an insulating component, for example, that can be used to produce a subtractive surface feature having an insulating feature inset therein.

In some embodiments, a paste comprises a conductive component and a masking component, for example, that can be used to produce electrically conductive masking features on a substrate.

Substrates

Substrates suitable for patterning by the method of the present invention are not particularly limited, and include any material having a surface capable of being contacted with a stamp. Substrates for use with the present invention include planar and non-planar substrates.

As used herein, a substrate is "planar" if, after accounting for random variations in the height of a substrate (e.g., surface roughness, waviness, etc.), four points on the surface of the substrate lie in approximately the same plane. Planar substrates can include, but are not limited to, windows, embedded circuits, laminar sheets, and the like. Planar substrates can include flat variants of the above having holes there through.

As used herein, a substrate is "non-planar" if, after accounting for random variations in the height of a substrate (e.g., surface roughness, waviness, etc.), four or more points on the surface of the substrate do not lie in the same plane. Non-planar substrates can include, but are not limited to, gratings, substrates comprising multiple different planar areas (i.e., "multi-planar" substrates), substrates having a tiered geometry, and combinations thereof. Non-planar substrates can comprise flat and/or curved areas.

As used herein, a substrate is "curved" when the radius of curvature of a substrate is non-zero over a distance of 100 μm or more, or 1 mm or more, across the surface of a substrate.

As used herein, a substrate is "rigid" when the plane, curvature, and/or geometry of a substrate cannot be easily distorted. Rigid substrates can undergo temperature-induced distortions due to thermal expansion, or become flexible at temperatures above a glass transition, melting point, and the like.

The plane, curvature, and/or geometry of a flexible substrate can be distorted flexed, and/or undergo elastic or plastic deformation, bending, compression, twisting, and the like in response to applied external force, stress, strain and/or torsion. Typically, a flexible substrate can be moved between flat and curved geometries. Flexible substrates suitable for use with the present invention include, but are not limited to, polymers (e.g., plastics), woven fibers, thin films, metal foils, composites thereof, laminates thereof, and combinations thereof. In some embodiments, a flexible substrate can be patterned using the methods of the present invention in a reel-to-reel manner.

Substrates for use with the present invention are not particularly limited by composition. Substrates suitable for use with the present invention include materials chosen from metals, crystalline materials (e.g., monocrystalline, polycrystalline, and partially crystalline materials), amorphous materials, conductors, semiconductors, insulators, optics, painted substrates, fibers, glasses, ceramics, zeolites, plastics, thermosetting and thermoplastic materials (e.g., optionally doped: polyacrylates, polycarbonates, polyurethanes, polystyrenes, cellulosic polymers, polyolefins, polyamides, polyimides, resins, polyesters, polyphenylenes, and the like), films, thin films, foils, plastics, polymers, wood, fibers, minerals, biomaterials, living tissue, bone, alloys thereof, composites thereof, laminates thereof, porous variants thereof, doped variants thereof, and combinations thereof.

In some embodiments, the substrates are transparent, translucent, or opaque to visible, UV, and/or infrared light). In some embodiments, a substrate for use with the present invention is substantially transparent in the wavelength range of about 450 nm to about 900 nm, or about 8 μm to about 13 μm.

In some embodiments, at least a portion of a substrate is conductive or semiconductive. As used herein, "conductive" and "semiconductive" materials include species, compounds, polymers, films, coatings, substrates, and the like capable of transporting or carrying electrical charge. Generally, the charge transport properties of a semiconductive material can be modified based upon an external stimulus such as, but not limited to, an electrical field, a magnetic field, a temperature change, a pressure change, exposure to radiation, and combinations thereof. In some embodiments, a conductive or semiconductive material has an electron or hole mobility of about $10^{-6}$ cm$^2$/V·s or more, about $10^{-5}$ cm$^2$/V·s or more, about $10^{-4}$ cm$^2$/V·s or more, about $10^{-3}$ cm$^2$/V·s or more, about 0.01 cm$^2$/V·s or more, or about 0.1 cm$^2$/V·s or more. Electrically conductive and semiconductive materials include, but are not limited to, metals, alloys, thin films, crystalline materials, amorphous materials, polymers, laminates, foils, plastics, and combinations thereof.

In some embodiments, a substrate to be patterned by a method of the present invention comprises a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof.

In some embodiments, a substrate to be patterned by a method of the present invention comprises a glass such as, but not limited to, undoped silica glass ($SiO_2$), fluorinated silica glass, borosilicate glass, borophosphorosilicate glass, organosilicate glass, porous organosilicate glass, and combinations thereof.

In some embodiments, a substrate to be patterned by a method of the present invention comprises a metal oxide such as, but not limited to, tin oxide, tin-doped indium oxide or indium-doped tin oxide ("ITO"), zinc oxide, aluminum-doped zinc oxide ("AZO"), gallium-dope zinc oxide ("GZO"), indium-doped cadmium oxide, copper-indium-gallium-selenide, copper-indium-gallium-sulfide, copper-indium-gallium-selenide doped with sulfide, cadmium telluride, and the like, and combinations thereof.

In some embodiments, a substrate to be patterned by a method of the present invention comprises a conductive metal oxide and/or a semiconductive metal oxide layer over an insulating underlayer. In some embodiments, the metal oxide has an optical transparency of about 60% or more, about 70% or more, about 80% or more, about 90% or more, about 95% or more at a wavelength of about 380 nm to about 1.8 µm. Thus, in some embodiments a substrate to be patterned by a process of the present invention comprises a transparent conductive oxide and an insulator such as, but not limited to, ITO on glass, AZO on glass, GZO on glass, zinc oxide on glass, and the like, and combinations thereof.

In some embodiments, the substrate comprises a ceramic such as, but not limited to, zinc sulfide ($ZnS_x$), boron phosphide ($BP_x$), gallium phosphide ($GaP_x$), silicon carbide ($SiC_x$), hydrogenated silicon carbide ($H:SiC_x$), silicon nitride ($SiN_x$), silicon carbonitride ($SiC_xN_y$) silicon oxynitride ($SiO_xN_y$), silicon oxycarbide ($SiO_xC_y$), silicon carbon-oxynitride ($SiC_xO_yN_z$), hydrogenated variants thereof, doped variants (e.g., n-doped and p-doped variants) thereof, and combinations thereof (where x, y, and z can vary independently from about 0.1 to about 5, about 0.1 to about 3, about 0.2 to about 2, or about 0.5 to about 1).

In some embodiments, a substrate to be patterned by a method of the present invention comprises a flexible substrate, such as, but not limited to: a plastic, a composite, a laminate, a thin film, a metal foil, and combinations thereof. In some embodiments, a flexible material can be patterned by the method of the present invention in a reel-to-reel manner.

In some embodiments, a substrate patterned by a process of the present invention has a surface area of about 400 $cm^2$ or greater, about 1,000 $cm^2$ or greater, about 2,000 $cm^2$ or greater, about 3,000 $cm^2$ or greater, about 5,000 $cm^2$ or greater, about 10,000 $cm^2$ or greater, about 20,000 $cm^2$ or greater, or about 30,000 $cm^2$ or greater.

The present invention contemplates optimizing the performance, efficiency, cost, and speed of the process steps by selecting pastes and substrates that are compatible with one another. For example, in some embodiments, a substrate can be selected based upon its optical transmission properties, thermal conductivity, electrical conductivity, and combinations thereof.

In some embodiments, the present invention is directed to a process for patterning ITO on glass comprising a method described herein that employs a paste that includes aqueous phosphoric acid and has a viscosity of about 80 cP to about 500 cP. In some embodiments, the paste further comprises poly-N-vinylpyrrolidone.

In some embodiments, the present invention is directed to a process for patterning ITO on glass comprising a method described herein that employs a paste that includes aqueous nitric acid and ferric chloride, and has a viscosity of about 80 cP to about 500 cP. In some embodiments, the paste further comprises poly-N-vinylpyrrolidone.

In some embodiments, a substrate is transparent to at least one type of radiation suitable for initiating a reaction of the paste on the substrate. For example, a substrate transparent to ultraviolet light can be used with a paste whose reaction can be initiated by ultraviolet light, which permits the reaction of a paste on the front-surface of a substrate to be initiated by illuminating a backside of the substrate with ultraviolet light.

The methods and product prepared therefrom are suitable for application in electrical systems, optical systems, consumer electronics, industrial electronics, automobiles, military applications, wireless systems, space applications, and any other applications in which a patterned substrate is required or desirable.

The present invention is also directed to articles, objects and devices comprising a patterned substrate prepared by a method of the present invention. Exemplary articles, objects and devices comprising the patterned substrates of the present invention include, but are not limited to, windows; mirrors; optical elements (e.g., optical elements for use in eyeglasses, cameras, binoculars, telescopes, and the like); lenses (e.g., fresnel lenses, etc.); watch crystals; optical fibers, output couplers, input couplers, microscope slides, holograms; cathode ray tube devices (e.g., computer and television screens); optical filters; data storage devices (e.g., compact discs, DVD discs, CD-ROM discs, and the like); flat panel electronic displays (e.g., LCDs, plasma displays, and the like); touch-screen displays (such as those of computer touch screens and personal data assistants); solar cells; flexible electronic displays (e.g., electronic paper and books); cellular phones; global positioning systems; calculators; graphic articles (e.g., signage); motor vehicles (e.g., wind screens, windows, displays, and the like); artwork (e.g., sculptures, paintings, lithographs, and the like); membrane switches; jewelry; and combinations thereof.

In some embodiments, the a patterned substrate prepared by a process of the present invention is used as a layer in a display or optical device that contains additional optional coatings applied thereto (e.g., filters, protective layers and/or anti-reflective coatings, and the like).

The surface area of a substrate is not particularly limited can be easily scaled by the proper design of equipment suitable for conducting a patterning process of the present invention, and can range, without limitation, from about 1 $mm^2$ to about 20 $m^2$, or about 1 $cm^2$ to about 10 $m^2$.

The patterned substrates prepared by a method of the present invention can be structurally and compositionally characterized using analytical methods known to those of ordinary skill in the art of thin film and/or surface characterization.

Stamps and Stencils

As used herein, a "stamp" refers to a three-dimensional object having on at least one surface of the stamp an indentation that defines a pattern. Stamps for use with the present invention are not particularly limited by geometry, and can be flat, curved, smooth, rough, wavy, and combinations thereof. In some embodiments, a stamp has a three dimensional shape suitable for conformally contacting a substrate.

In some embodiments, a stamp can comprise multiple patterned surfaces that comprise the same, or different patterns. In some embodiments, a stamp comprises a cylinder wherein one or more indentations in the curved face of the cylinder define a pattern. As the cylindrical stamp is rolled across a surface, the pattern is repeated. Paste or ink can be applied to a cylindrical stamp as it rotates. For stamps having multiple patterned surfaces: cleaning, applying, contacting, removing, and reacting steps can occur simultaneously on the different surfaces of the same stamp.

Stamps for use with the present invention are not particularly limited by materials, and can be prepared from materials such as, but not limited to, glass (e.g., quartz, sapphire, borosilicate glass), ceramics (e.g., metal carbides, metal nitrides, metal oxides), plastics, metals, and combinations thereof. In some embodiments, a stamp for use with the present invention comprises an elastomeric polymer (i.e., an elastomer).

As used herein, an "elastomeric stamp" refers to a molded three-dimensional object comprising an elastomeric polymer, and having on at least one surface of the stamp an indentation that defines a pattern. More generally, stamps comprising an elastomeric polymer are referred to as elastomeric stamps. As used herein, an "elastomeric stencil" refers to a molded three dimensional object comprising an elastomeric polymer, and having at least one opening that penetrates through two opposite surfaces of the stencil to form an opening in the surface of the three dimensional object. An elastomeric stamp or stencil can further comprise a stiff, flexible, porous, or woven backing material, or any other means of preventing deformation of the stamp or stencil when it is used during processes described herein. Similar to stamps, elastomeric stencils for use with the present invention are not particularly limited by geometry, and can be flat, curved, smooth, rough, wavy, and combinations thereof.

Elastomers suitable for use as a materials in a stamp include, but are not limited to, a polyurethane, a resilin, an elastin, a polyimide, a phenol formaldehyde polymer, a polydialkylsiloxane (e.g., polydimethylsiloxane, "PDMS" such as SYLGARD® products available from Dow Corning, Midland, Mich.), a natural rubber, a polyisoprene, a butyl rubber, a halogenated butyl rubber, a polybutadiene, a styrene butadiene, a nitrile rubber, a hydrated nitrile rubber, a chloroprene rubber (e.g., polychloroprene, available as NEOPRENE™ and BAYPREN®, Farbenfabriken Bayer AG Corp., Leverkusen-Bayerwerk, Germany), an ethylene propylene rubber, an epichlorohydrin rubber, a polyacrylic rubber, a silicone rubber, a fluorosilicone rubber, a fluoroelastomer (for example, those described herein, supra), a perfluoroelastomer, a tetrafluoroethylene/propylene rubber, a chlorosulfonated polyethylene, an ethylene vinyl acetate, cross-linked variants thereof, halogenated variants thereof, and combinations thereof. Other suitable materials and methods to prepare elastomeric stamps suitable for use with the present invention are disclosed in U.S. Pat. Nos. 5,512,131; 5,900,160; 6,180,239; and 6,776,094; and pending U.S. application Ser. No. 10/766, 427, all of which are incorporated herein by reference in their entirety. Additional stamps suitable for use with the present invention and methods of preparing the stamps are provided in co-pending U.S. patent application Ser. Nos. 12/052,329, 12/189,485 and 61/165,755, all of which are incorporated herein by reference in their entirety.

In some embodiments, an elastomer for use as stamp with the present invention has a Young's modulus of about 20 MPa or less, about 15 MPa or less, about 12.5 MPa or less, about 10 MPa or less, about 7.5 MPa or less, about 5 MPa or less, or about 2 MPa or less. In some embodiments, an elastomer for use as stamp with the present invention has a Young's modulus of about 2 MPa to about 20 MPa, about 2 MPa to about 15 MPa, about 2 MPa to about 10 MPa, about 5 MPa to about 20 MPa, about 5 MPa to about 15 MPa, or about 10 MPa to about 20 MPa.

In some embodiments, a stamp for use with the present invention has a surface area of about 40,000 $mm^2$ or greater, about 50,000 $mm^2$ or greater, about 60,000 $mm^2$ or greater, about 75,000 $mm^2$ or greater, about 100,000 $mm^2$ or greater, about 125,000 $mm^2$ or greater, or about 150,000 $mm^2$ or greater.

The stamps of the present invention are substantially robust and can be utilized numerous times without degradation of the stamp surface, and without loss of feature size. In some embodiments, a stamp of the present invention is capable of patterning at least 10, at least 15, at least 20, at least 30, at least 40, at least 50, at least 100, at least 200, at least 500, or at least 1,000 substrates prior to exhibiting a deviation of about 5% or more or about 10% or more in a lateral dimension of a surface feature prepared therefrom.

Figure 3:
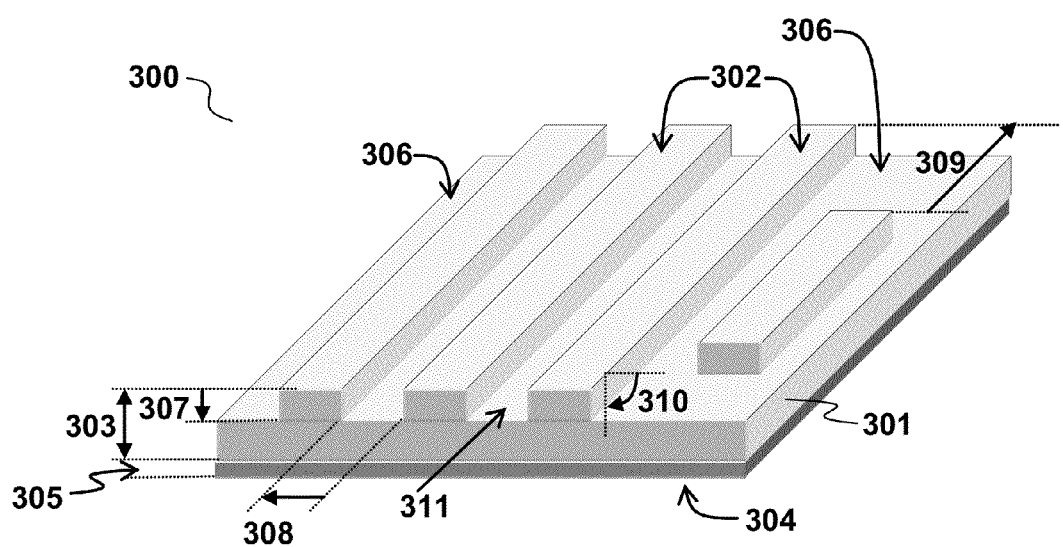
FIGS. 3 and 4 provide three-dimensional cross-sectional representations of stamps suitable for use with the present invention.

FIG. 3 provides a three-dimensional schematic representation, 300, of a stamp suitable for use with the present invention. Referring to FIG. 3, a stamp, 301, including a surface, 302, having thickness, 303, is provided. In some embodiments, a stamp comprises a backing layer, 304, having a thickness, 305. A backing layer can increase the dimensional stability of a stamp. In some embodiments, a backing layer is rigid, semi-rigid, webbed, multi-laminate, or a combination thereof. In some embodiments, a backing layer has the same or a similar composition as a material present in the stamp, but with a greater density.

Referring to FIG. 3, the stamp surface, 302, includes at least one indentation therein, 306. The at least one indentation, 306, has a depth, 307. The geometry of the at least one indentation can be flat, curved (e.g., concave and/or convex), and combinations thereof. The at least one indentation has lateral dimensions 308 (width) and 309 (length), each of which can be controlled independently. The lateral dimensions of indentations can be the same or different across the surface of a stamp. The at least one indentation also includes a sidewall angle, 310, which refers to the angle that the surface of the indentation makes with the surface of the stamp, 302. In some embodiments, an indentation has a sidewall angle of about 90°±50°, about 90°±40°, about 90°±30°, about 90°±20°, about 90°±15°, about 90°±10°, or about 90°±5°. In some embodiments, a pattern of indentations in a stamp surface creates an array of channels in a surface of a stamp, 311, the length and width of which is defined by the indentations on a stamp.

In some embodiments, a stamp surface, 302, and/or a surface of the at least one indentation, 306, can be functionalized and/or derivatized to provide a hydrophilic surface or a hydrophobic surface.

In some embodiments, a stamp of the present invention comprises at least one indentation having a surface area of greater than 1 $mm^2$ and having a channel fluidly connecting the at least one indentation with a back surface of the stamp, wherein the channel is suitable for dissipating a trapped gas or excess etch paste from the at least one indentation.

Figure 4:
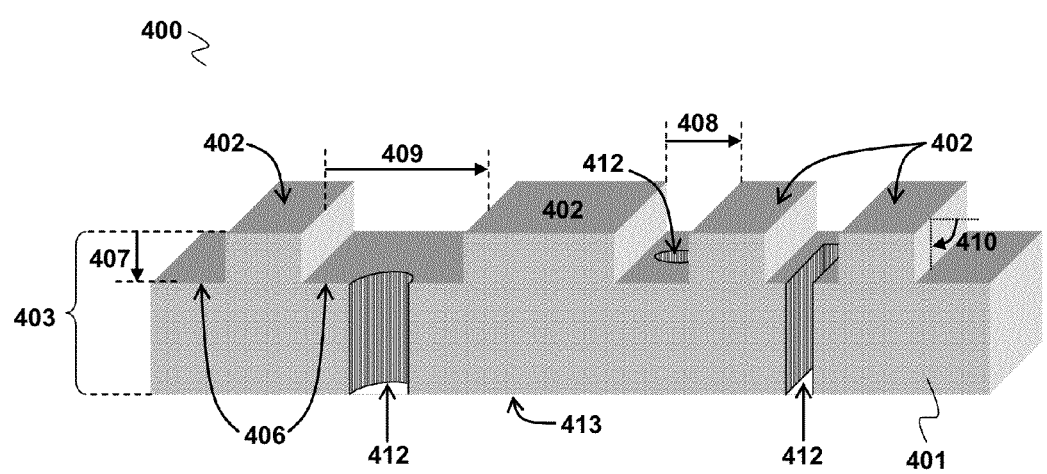

FIG. 4 provides a three-dimensional schematic representation, 400, of a stamp suitable for use with the present invention. Referring to FIG. 4, a stamp, 401, including a surface, 402, having thickness, 403, is provided. The stamp surface, 402, includes at least one indentation therein, 406, which has a depth, 407. The geometry of the at least one indentation can be flat, curved (e.g., concave and/or convex), and combinations thereof. The at least one indentation has a lateral dimensions 408 and 409, which can be controlled independently such that lateral dimensions of indentations can be the same or different across the surface of a stamp. The at least one indentation also includes a sidewall angle, 410.

Referring to FIG. 4, the indentations, 406, optionally include a channel, 412, that fluidly connects the at least one indentation with a back surface of the stamp, 413, wherein the channel is suitable for dissipating a trapped gas or excess etch paste from the at least one indentation. The channel, 412, can have a cross-sectional area in the shape of a circle, ellipse, polygon (e.g., triangle, square, pentagon, hexagon, octagon, and the like), a rectilinear shape (e.g., rectangle, diamond, and the like), a elongated rectangle or ellipse (e.g., a slit), and the like, and combinations thereof. In some embodiments, a channel is tapered from a backside of a stamp to an interior surface of the at least one indentation.

In some embodiments, a channel, 412, has a lateral dimension of about 1 µm to about 20 mm, about 1 µm to about 15 mm, about 1 µm to about 10 mm, about 1 µm to about 5 mm, about 1 µm to about 1 mm, about 10 µm to about 20 mm, about 10 µm to about 15 mm, about 10 µm to about 10 mm, about 10 µm to about 5 mm, about 10 µm to about 1 mm, about 10 µm to about 500 µm, about 10 µm to about 100 µm, about 20 µm to about 20 mm, about 20 µm to about 15 mm, about 20 µm to about 10 mm, about 20 µm to about 5 mm, about 20 µm to about 1 mm, about 100 µm to about 20 mm, about 100 µm to about 15 mm, about 100 µm to about 10 mm, about 100 µm to about 5 mm, about 100 µm to about 1 mm, about 500 µm to about 20 mm, about 500 µm to about 15 mm, about 500 µm to about 10 mm, about 500 µm to about 5 mm, about 500 µm to about 1 mm, about 1 mm to about 20 mm, about 1 mm to about 15 mm, about 1 mm to about 10 mm, 5 mm to about 20 mm, or about 10 mm to about 20 mm.

In some embodiments, a channel is a slit that runs along a portion of the periphery of an indention, and has a width of about 20 µm, about 50 µm, about 100 µm, about 200 µm, or about 500 µm, and a length of at least 1 mm or more. In those embodiments in which surface features comprising a channel-like structure are formed on a substrate a channel can be present in an indentation of a stamp such that the indentation and channel are substantially in-line with one another and the channel has a width less than a lateral dimension of the at least one indentation.

In some embodiments, a surface of the channel, 412, is functionalized and/or derivatized to provide a hydrophilic surface or a hydrophobic surface. For example, a surface of a channel can be derivatized with a plasma, a SAM-forming species, and the like, and combinations thereof.

Applying and Reacting the Paste

Pastes can be applied to a surface of a stamp or a surface of a substrate by methods known in the art such as, but not limited to, screen printing, ink jet printing, syringe deposition, spraying, spin coating, brushing, and combinations thereof, and other application methods known to persons of ordinary skill in the art of coating surfaces. In some embodiments, a paste is poured onto a surface of a stamp, and then a blade is moved transversely across the surface to ensure that the indentations in the stamp are completely and uniformly filled with the paste. The blade can also remove excess paste from the surface of a stamp. Applying a paste to a substrate or the surface of the stamp can comprise rotating the surface at about 100 revolutions per minute (rpm) to about 5,000 rpm, or about 1,000 rpm to about 3,000 rpm, while pouring or spraying the paste onto the rotating surface.

In some embodiments, a paste is applied to a stamp to substantially fill the at least one indentation in the surface of the stamp. However, the methods of the present invention advantageously do not require that a paste be applied solely or preferentially to the at least one indentation. For example, a paste can be applied uniformly to a surface of a stamp in a conformal manner or as a blanket layer. Thus, the present invention provides a significant advantage over previously developed patterning methods that involve an etchant, which relied upon sequestering a paste at a particular region of a substrate at all times during the patterning process. For example, screen printing processes rely upon openings in a screen or stencil to deposit a paste in a desired area of a substrate. In another example, previously known soft lithography methods for etching a substrate (see, e.g., U.S. Pat. No. 5,925,259) relied upon preferential wetting of a stamp indentation by an etchant in order to sequester a reactive etchant in an indentation. Such processes require time-consuming stamp preparation steps in order to provide a stamp having a heterogeneous surface. On the other hand, the methods of the present invention are able to pattern substrates using a stamp having a homogeneous surface in which a paste is applied in a homogeneous, random, or otherwise non-spatially resolved manner to a substrate and/or the stamp.

Furthermore, the methods of the present invention do not require mechanical manipulation of a paste using, e.g., a squeegee, doctor blade, meyer bar (i.e., mayer rod), or other mechanical means to remove excess paste from a substrate and/or stamp surface prior to and/or during the contacting. Nonetheless, in some embodiments a method of the present invention comprises mechanically manipulating a paste that is provided on a stamp and/or substrate surface prior to conformally contacting the stamp and the substrate.

As used herein, "doctor blade" refers to a process in which a straight edge of a rigid or semi-rigid substrate traverses a surface of a coated stamp to substantially remove ink or paste from the surface of the stamp and ensure that indentations in the surface of the stamp are substantially uniformly filled with an ink or paste.

As used herein, a "squeegee" refers to a process in which a flexible blade (e.g., an elastomer such as rubber) traverses a surface of a coated stamp and/or coated substrate, thereby removing excess ink or paste from the surface.

As used herein, a "mayer bar" process refers to a process in which an optionally coated metal bar is used to traverse the surface of a coated stamp or substrate to provide a controlled and consistent thickness of a printing ink and/or paste thereon.

In some embodiments, as discussed herein, a stamp includes a hydrophilic surface that is readily wetted by a paste. Thus, in some embodiments a paste can be substantially uniformly applied to a stamp of the present invention. Not being bound by any particular theory, a stamp having a hydrophilic surface can be readily wetted by a hydrophilic paste such that the paste is adsorbed to the stamp surface and does not collect or pool on a stamp surface. However, in some embodiments a paste is not substantially absorbed into a stamp of the present invention because only a surface layer of a stamp is hydrophilic whereas a body of the stamp contains hydrophobic groups (e.g., Si—$CH_3$ groups). Thus, the method of the present invention provides advantages over processes that utilize a stamp capable of absorbing a paste.

Not being bound by any particular theory, as the lateral dimensions of the indentation in the stamp become smaller, the viscosity of the paste can be decreased in order to ensure a paste can flow from, e.g., a location between a stamp and a substrate that are in conformal contact with each other to a volume defined by the at least one indentation and the substrate.

In some embodiments, the composition of a paste can be formulated to control its viscosity. Parameters that can control paste viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between paste components (e.g., solvent-thickener interactions), and combinations thereof.

In some embodiments, the viscosity of a paste is modified during one or more of an applying step, contacting step, reacting step, or combinations thereof. For example, the viscosity of a paste can be decreased while applying the paste to a surface of a stamp to ensure that indentations in the surface of a stamp are filled completely and uniformly. After contacting the coated stamp with a substrate, the viscosity of the paste can be increased to ensure that the lateral dimensions of the indentations in the stamp are transferred to the lateral dimensions of a surface feature formed on the substrate.

Not being bound by any particular theory, the viscosity of a paste can be controlled by an external stimulus such as temperature, pressure, pH, the presence or absence of a reactive species, electrical current, a magnetic field, and combinations thereof. For example, increasing the temperature of a paste will typically decrease its viscosity; and increasing the pressure applied to a paste will typically increase its viscosity.

The pH of a paste either increases or decreases the viscosity of a paste depending on the properties of one or more components in the paste, depending on the overall solubility of the component mixture as a function of pH. For example, an aqueous paste containing a weakly acidic polymer will typically have a decreased viscosity below the $pK_a$ of the polymer because the solubility of the polymer will increase below its $pK_a$. However, if protonation of the polymer leads to an ionic interaction between the polymer and another component in the paste that decreases the solubility of the polymer, then the viscosity of the paste will likely increase. Careful selection of paste components permits paste viscosity to be controlled over a wide range of pH values.

Transfer of the paste from a surface of a stamp to a substrate can be promoted by one or more interactions between the paste and the surface of the stamp, between the paste and the substrate, between the surface of the stamp and the substrate, and combinations thereof that promote(s) adhesion of a paste to an area of a substrate. Not being bound by any particular theory, adhesion of a paste to a substrate can be promoted by gravity, a Van der Waals interaction, a covalent bond, an ionic interaction, a hydrogen bond, a hydrophilic interaction, a hydrophobic interaction, a magnetic interaction, and combinations thereof. Conversely, the minimization of these interactions between a paste and the surface of a stamp can facilitate transfer of the paste from the surface of the stamp to the substrate.

The method of the present invention comprises conformally contacting a stamp or elastomeric stencil with a substrate, which is facilitated by applying pressure or vacuum to the backside of one or both the stamp, stencil and/or substrate. In some embodiments, applying pressure and/or vacuum ensures that a paste is substantially removed from between the substrate and the stamp or stencil. In some embodiments, applying pressure or vacuum ensures that there is conformal contact between the entire surface of the stamp and the substrate. In some embodiments, applying pressure or vacuum minimizes the presence of gas bubbles present between the surfaces of the stamp and the substrate, or gas bubbles present in an indentation in the surface of the stamp, or gas bubbles present in the paste prior to reacting the paste. Not being bound by any particular theory, the removal of gas bubbles can facilitate in the reproducible formation of surface features having lateral dimensions of 50 µm or less, as well as reproducible formation of surface features having lateral dimensions of 100 µm or more or 500 µm or more.

Pressure is substantially uniformly applied to a backside of a stamp in order to isolate the etch paste within a volume provided by the at least one indentation and the substrate. A substantially uniformly applied pressure on a backside of a stamp is also effective to substantially remove etch paste from between the surface of the stamp and the substrate.

In some embodiments, the applying pressure comprises substantially evenly applying about 50 kPa to about 300 kPa, about 50 kPa to about 250 kPa, about 50 kPa to about 200 kPa, about 50 kPa to about 175 kPa, about 50 kPa to about 150 kPa, about 50 kPa to about 125 kPa, about 50 kPa to about 100 kPa, about 75 kPa to about 300 kPa, about 75 kPa to about 250 kPa, about 75 kPa to about 200 kPa, about 75 kPa to about 150 kPa, or about 100 kPa to about 300 kPa, about 100 kPa to about 250 kPa, about 100 kPa to about 200 kPa, or about 150 kPa to about 300 kPa to the backside of the stamp.

In some embodiments, a substrate, a stamp surface, and/or an indentation in a stamp can be functionalized, derivatized, textured, or otherwise. As used herein, "pre-treating" refers to chemically or physically modifying a surface. Pre-treating can include, but is not limited to, cleaning, oxidizing, reducing, derivatizing, functionalizing, exposing a surface to a reactive gas, plasma, thermal energy, ultraviolet radiation, and combinations thereof. Not being bound by any particular theory, pre-treating a surface can increase or decrease an adhesive interaction between a surface and a layer comprising a nanowire or a polymer composition.

In some embodiments, the surface of a substrate and/or the surface of a stamp is uniformly patterned, functionalized, derivatized, textured, or otherwise pre-treated. As used herein, "pre-treating" refers to chemically or physically modifying a surface prior to applying or reacting a paste. Pre-treating can include, but is not limited to, cleaning, oxidizing, reducing, derivatizing, functionalizing, exposing to a reactive gas, exposing to a plasma, exposing to a thermal energy (e.g., convective thermal energy, radiant thermal energy, conductive thermal energy, and combinations thereof), exposing to an electromagnetic radiation (e.g., x-rays, ultraviolet light, visible light, infrared light, and combinations thereof), and combinations thereof. Pre-treating typically occurs prior to disposing a paste thereon (either a substrate and/or a stamp) and/or contacting a stamp with a coated substrate (and vice versa).

Not being bound by any particular theory, pre-treating a surface of a stamp and/or a substrate can increase or decrease an adhesive interaction between a paste and a surface, and facilitate the formation of surface features having a lateral dimension of about 50 µm or less.

For example, derivatizing a surface of a stamp and/or substrate with a polar functional group (e.g., oxidizing the surface) can promote the wetting of a surface by a hydrophilic paste and deter surface wetting by a hydrophobic paste. Moreover, hydrophobic and/or hydrophilic interactions can be used to prevent a paste from penetrating into the body of a stamp.

In some embodiments, derivatizing a surface of an indentation with a fluorocarbon functional group can facilitate the transfer of a hydrophilic paste from the hydrophobic indentation to a hydrophilic substrate. However, the present invention has surprisingly found that superior reproducibility of feature size over large surface-area substrates (e.g., substrates having a surface area of 400 $cm^2$ or more) having a hydrophilic surface can be achieved when the hydrophilic substrate is patterned using a hydrophilic paste in combination with a stamp having a hydrophilic surface. Even more surprising is that superior patterning results are obtained when both a stamp surface and an indentation are substantially uniformly hydrophobic. Thus, in some embodiments a method of the present invention includes a pre-treatment process in which a stamp surface is rendered substantially uniformly hydrophilic.

As used herein, "hydrophilic" refers to an attraction to water, and includes surfaces that form a contact angle with a water droplet of about 90° or less. In some embodiments, a stamp of the present invention is rendered hydrophilic such that a water droplet on the stamp surface and/or an indentation therein forms a contact angle of about 90° or less, about 80° or less, about 70° or less, about 60° or less, about 50° or less, about 45° or less, about 40° or less, about 35° or less, about 30° or less, about 25° or less, about 20° or less, about 15° or less, or about 10° or less. Contact angles with water can be measured using, e.g., a contact angle goniometer by methods known to persons of ordinary skill in the art. In some embodiments, a stamp of the present invention is rendered hydrophilic such that a water droplet on the stamp surface and/or an indentation therein forms a contact angle of about 10° to about 90°, about 10° to about 80°, about 10° to about 70°, about 10° to about 60°, about 10° to about 50°, about 10° to about 45°, about 10° to about 40°, about 10° to about 35°, about 10° to about 30°, about 10° to about 25°, about 20° to about 90°, about 20° to about 80°, about 20° to about 70°, about 20° to about 60°, about 20° to about 50°, about 20° to about 40°, about 30° to about 90°, about 30° to about 80°, about 30° to about 70°, about 30° to about 60°, about 30° to about 50°, about 40° to about 90°, about 40° to about 80°, about 40° to about 70°, about 50° to about 90°, about 50° to about 80°, about 60° to about 90°, or about 70° to about 90°. In some embodiments, a stamp surface is rendered hydrophilic, but to a degree such that the stamp surface is less hydrophilic than a substrate.

In preferred embodiments, a patterning process of the present invention comprises pre-treating a stamp surface with an oxygen plasma for a period of time sufficient to render the stamp surface substantially uniformly hydrophilic. As used herein, "substantially uniformly hydrophilic" refers to a stamp surface that has a substantially homogeneous surface chemistry across the surface of the stamp and the indentations therein (e.g., a number of Si—OH and/or Si—$CH_3$ groups), has a substantially homogeneous density across the surface of the stamp and the indentations therein, and/or has a substantially homogeneous hydrophilicity (as measured via contact angle goniometry or another known method) across the surface of the stamp and the indentations therein.

In some embodiments, pre-treating comprises exposing a stamp to an oxygen plasma for an amount of time sufficient to render the stamp surface (and at least one indentation therein) substantially uniformly hydrophilic without inducing cracking in the stamp surface. Not being bound by any particular theory, a stamp surface can undergo cracking upon exposure to an oxygen plasma due to the formation of a surface layer of a silicate (i.e., $SiO_x$, wherein x is about 2). While a silicate surface layer can be formed on a stamp during a pre-treating process of the present invention, any surface layer formed thereon should not result in the formation of cracks in the stamp surface.

The method of the present invention produces surface features by reacting a paste with an area of a substrate. As used herein, "reacting" refers to initiating a chemical reaction comprising at least one of: reacting one or more components present in the paste with each other, reacting one or more components of a paste with a surface of a substrate, reacting one or more components of a paste with sub-surface region of a substrate, and combinations thereof.

In some embodiments, reacting comprises applying a paste to a substrate (i.e., a reaction is initiated upon contact between a paste and a surface of a substrate).

In some embodiments, reacting the paste comprises a chemical reaction between the paste and a functional group on the substrate, or a chemical reaction between the paste and a functional group below the surface of the substrate. Thus, methods of the present invention comprise reacting a paste or a component of a paste not only with a surface of a substrate, but also with a region of a substrate below its surface, thereby forming inset or inlaid features in a substrate. Not being bound by any particular theory, a component of a paste can react with a substrate by reacting on the surface of the substrate, or penetrating and/or diffusing into the substrate. In some embodiments, the penetration of a paste into the surface of a substrate can be facilitated by the application of physical pressure or vacuum to the backside of a stamp, stencil, substrate, or combinations thereof.

Reaction between a paste and a substrate can modify one or more properties of substrate, wherein the change in properties is localized to the portion of the substrate that reacts with the paste. For example, a reactive metal particle can penetrate into the surface of a substrate, and upon reacting with the substrate, modify its conductivity. In some embodiments, a reactive component can penetrate into the surface of a substrate and react selectively to increase the porosity of the substrate in the areas (volumes) where reaction occurs. In some embodiments, a reactive component can selectively react with a crystalline substrate to increase or decrease its volume, or change the interstitial spacing of a crystalline lattice.

In some embodiments, reacting a paste comprises chemically reacting a functional group on the surface of a substrate with a component of the paste. Not being bound by any particular theory, a paste containing a reactive component can also react with only the surface of a substrate (i.e., no penetration and reaction with a substrate occurs below its surface). In some embodiments, a patterning method wherein only the surface of a substrate is changed can be useful for subsequent self-aligned deposition reactions.

In some embodiments, reacting the paste with a substrate can comprise reactions that propagate into the plane (i.e., body) of a substrate, as well as reactions in the lateral plane of a surface of the substrate. For example, a reaction between an etchant and a substrate can comprise the etchant penetrating into the surface of the substrate (i.e., penetration orthogonal to the surface), such that the lateral dimensions of the lowest point of the surface feature are approximately equal to the dimensions of the feature at the surface of the substrate.

In some embodiments, etching reactions also occur laterally between a paste and a substrate, such that the lateral dimensions at the bottom of a surface feature are more narrow than the lateral dimensions of the feature at the plane of the surface. As used herein, "undercut" refers to situations when the lateral dimensions of a surface feature are greater than the lateral dimensions of a stamp used to apply a paste to form the surface feature. Typically, undercut is caused by reaction of an etchant or reactive species with a surface in a lateral dimension, and can lead to the formation of beveled edges on subtractive features.

Figure 7:
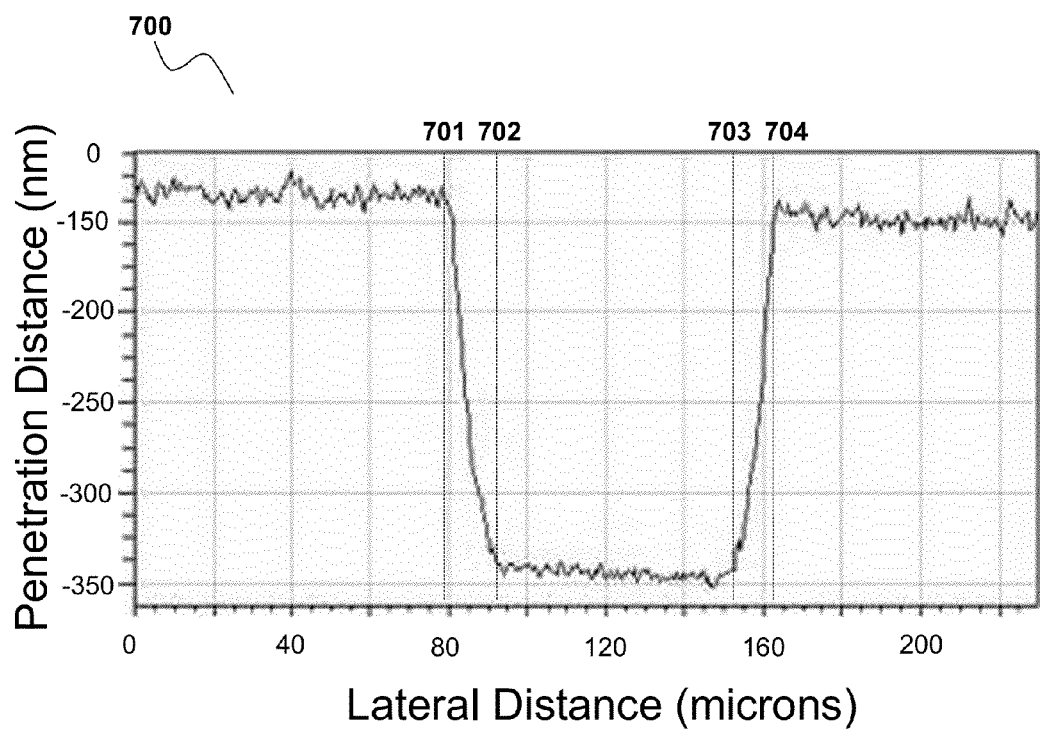
FIG. 7 provides a graphical representation of a lateral profile of the subtractive non-penetrating features on an ITO on glass substrate, as shown in FIG. 5, as determined by optical profilometry.
Figure 10:
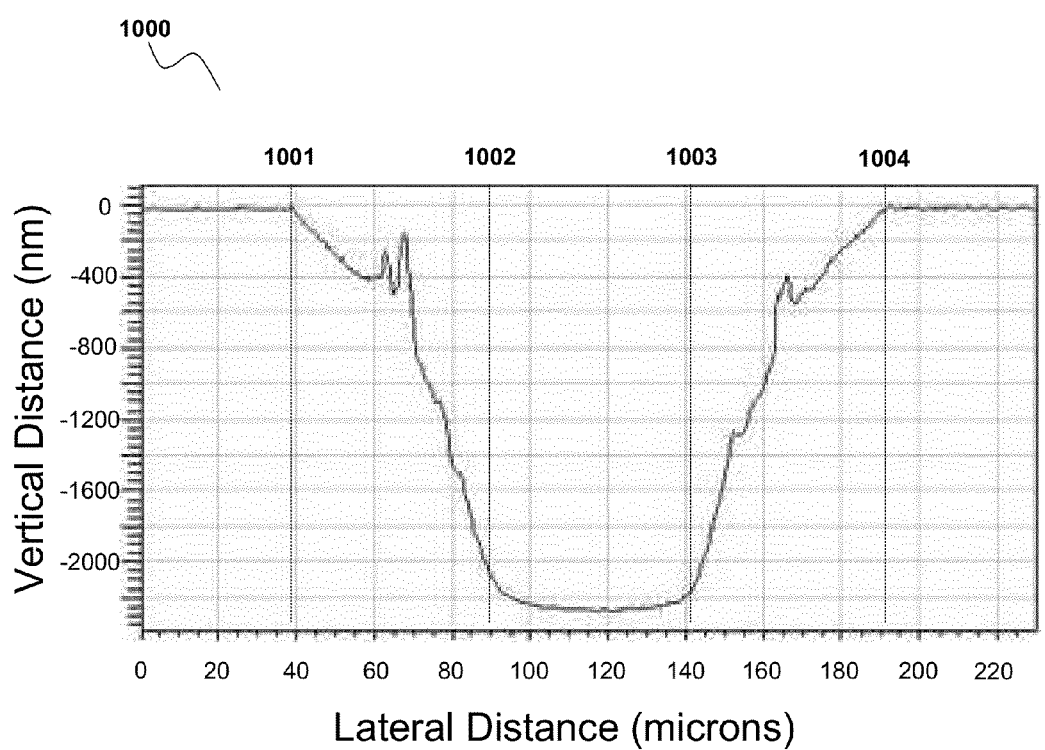
FIG. 10 provides a graphical representation of a lateral profile of the subtractive non-penetrating features on a glass slide, as shown in FIG. 8, as determined by optical profilometry.

The lateral scans of surface features that are displayed in FIGS. 7 and 10 show evidence of undercut. Referring to FIG. 7, portions of the substrate between lines 701 and 702, and lines 703 and 704, respectively, were removed due to a reaction of an etchant reacting laterally into the substrate. Referring to FIG. 10, portions of the substrate between lines 1001 and 1002, and lines 1003 and 1004, respectively, were removed due to a reaction of an etchant reacting laterally into the substrate. The surface features that are measured in both FIGS. 7 and 10 were prepared using elastomeric stencils having openings of 50 μm. Despite the evidence of undercut, the surface features depicted in FIGS. 5 and 8 demonstrate the applicability of the method of the present invention to forming surface features having a lateral dimension of 100 μm or less.

Figure 8:
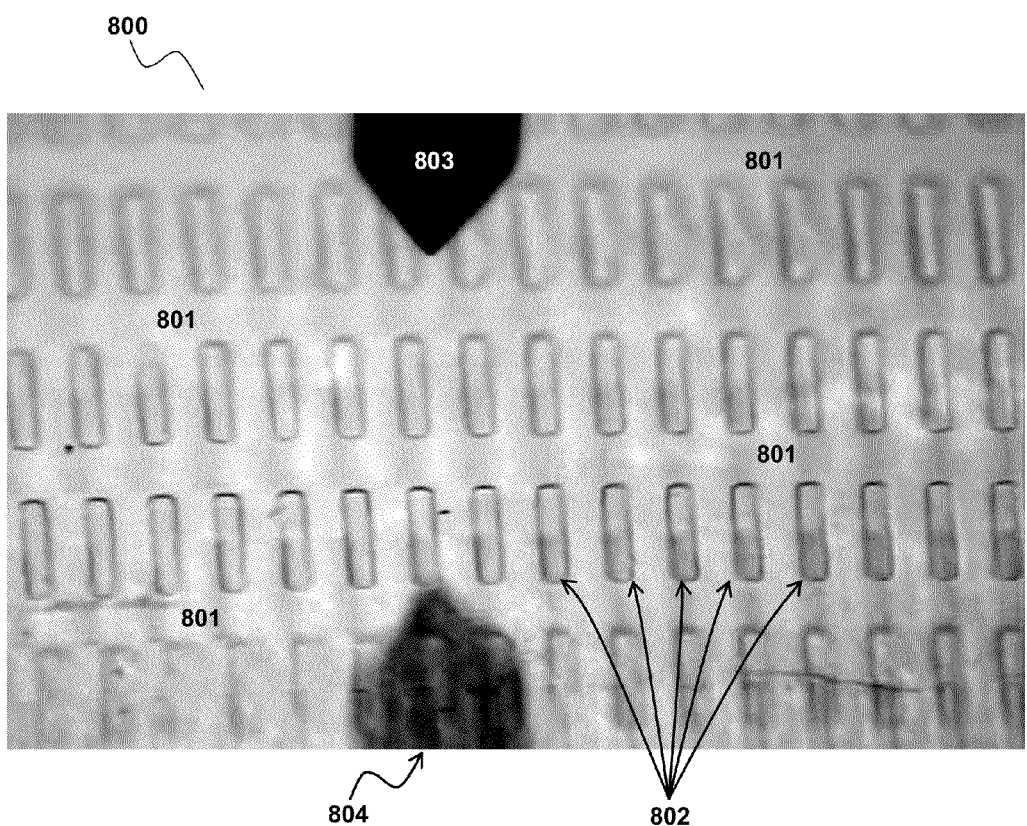
FIG. 8 provides an image of a glass ($SiO_2$) substrate having subtractive non-penetrating surface features thereon produced by a method of the present invention, as described in Example 8.
Figure 9:
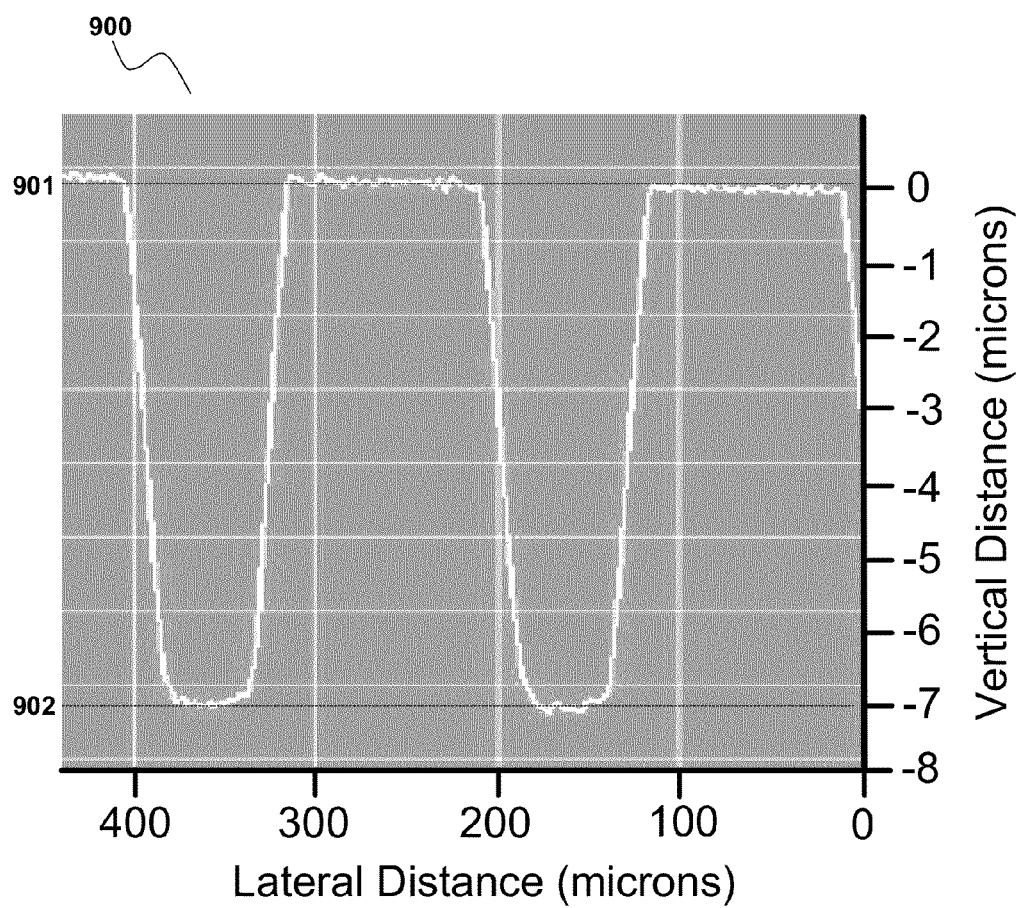
FIG. 9 provides a graphical representation of an elevation profile of the subtractive non-penetrating features on a glass slide, as shown in FIG. 8.

Comparing the undercut of the lateral profiles of surface features provided in FIG. 7 with that of FIG. 10, it is seen that the surface feature in FIG. 10 has a higher degree of undercut (about 50 μm, compared to about 10 μm for the feature in FIG. 7). However, the surface features shown in FIGS. 5-7 have a depth of about 30 nm, while the surface features in FIGS. 8-10 have a depth of about 6.8 μm (about 6,800 nm). Thus, a more accurate comparison of undercut for the etching paste/surface material combination used to produce these features (see Examples 5 and 8, respectively), would be to compare the etching rate in the lateral vs. vertical directions. The surface features of FIGS. 5-7 display about 10 μm of undercut occurred after etching about 30 nm of the material, to give a rate of 1 μm of undercut per 3 nm vertical etch. The surface features in FIGS. 8-10 show about 50 μm of undercut occur after etching about 6.8 μm of the material, to give a rate of 1 μm of undercut per 136 nm vertical etch. Thus, despite the higher amount of undercut shown in FIGS. 8-10, the selectivity of the etching paste in the vertical vs. lateral dimension is significantly better than that which produced the surface features shown in FIGS. 5-7. The combination of etching paste and surface material used in Example 8, would therefore permit a subtractive surface feature having a depth of 136 nm to be formed having an undercut of only 1 μm. Thus, the time of reaction is a parameter that can be selected to enable the formation of subtractive surface features having minimum undercut, and lateral dimensions identical to the lateral dimensions of a stamp or elastomeric stencil used to apply the paste to the surface.

In some embodiments, reacting the paste comprises removing solvent from the paste. Not being bound by any particular theory, the removal of solvent from a paste can solidify the paste, or catalyze cross-linking reactions between components of a paste. For pastes containing solvents with a low boiling point (e.g., b.p.<60° C.), the solvent can be removed without heating of a surface. Solvent removal can also be achieved by heating the surface, paste, or combinations thereof.

In some embodiments, reacting the paste comprises cross-linking components within the paste. Cross-linking reactions can be intramolecular or intermolecular, and can also occur between a component and the substrate.

In some embodiments, reacting the paste comprises sintering metal particles present in the paste. Not being bound by any particular theory, sintering is a process in which metal particles join to form a continuous structure within a surface feature without melting. Sintering can be used to form both homogeneous and heterogeneous metal surface features.

In some embodiments, a process of the present invention includes an initiating step. As used herein, "initiating" refers to a process in which a reaction between a substrate and a paste is triggered. Initiating processes suitable for use with the present invention include, but are not limited to, exposing at least one of a substrate, an etch paste, and a stamp to: thermal energy, electromagnetic radiation, acoustic waves, an oxidizing or reducing plasma, an electron beam, a stoichiometric chemical reagent, a catalytic chemical reagent, an oxidizing or reducing reactive gas, an acid or a base (e.g., a decrease or increase in pH), an increase or decrease in pressure, an alternating or direct electrical current, agitation, sonication, friction, and the like, and combinations thereof. In some embodiments, at least one of a substrate, a paste and a stamp are individually or collectively exposed to multiple reaction initiators.

Electromagnetic radiation suitable for use as a reaction initiator can include, but is not limited to, microwave light, infrared light, visible light, ultraviolet light, x-rays, radiofrequency, and combinations thereof.

In some embodiments, at least one of a stamp, a paste, and/or a substrate is maintained at a temperature of about 25° C. or less, and the temperature is then increased. Thus, the present invention includes a process in which a combination of a paste and a substrate capable of undergoing reaction at or near room temperature are utilized in which a reaction is not initiated upon either of contacting a paste with a substrate or contacting a coated stamp with a substrate. Instead, the paste, stamp and/or substrate are maintained at or below a temperature at which reacting does not substantially occur, and a reaction is initiated by heating the paste, stamp and/or substrate to a temperature at or above 25° C. for a period of time sufficient to react the paste with the substrate.

In some embodiments, at least one of a stamp, a paste and/or a substrate is maintained at a temperature of about −196° C. to about 20° C., about −196° C. to about 10° C., about −196° C. to about 0° C., about −196° C. to about −10° C., about −196° C. to about −25° C., about −196° C. to about −50° C., about −196° C. to about −100° C., about −150° C. to about 20° C., about −150° C. to about 10° C., about −150° C. to about 0° C., about −150° C. to about −10° C., about −150° C. to about −20° C., about −150° C. to about −30° C., about −150° C. to about −50° C., about −125° C. to about 20° C., about −125° C. to about 10° C., about −125° C. to about 0° C., about −125° C. to about −10° C., about −125° C. to about −20° C., about −125° C. to about −30° C., about −125° C. to about −50° C., about −100° C. to about 20° C., about −100° C. to about 10° C., about −100° C. to about 0° C., about −100° C. to about −10° C., about −100° C. to about −20° C., about −100° C. to about −30° C., about −100° C. to about −40° C., about −50° C. to about 20° C., about −50° C. to about 10° C., about −50° C. to about 0° C., about −50° C. to about −10° C., about −50° C. to about −20° C., about −20° C. to about 20° C., about −20° C. to about 10° C., about −20° C. to about 0° C., about −10° C. to about 20° C., about −10° C. to about 10° C., or about 0° C. to about 20° C. In such embodiments, initiating a reaction comprises heating (either actively and/or passively) at least one of the substrate, the paste and/or the stamp to a temperature at which a reaction between the paste and the substrate begins.

In some embodiments, the initiating comprises heating at least one of the substrate, the stamp and the etch paste at a temperature of about 80° C. to about 200° C., about 80° C. to about 180° C., about 80° C. to about 160° C., about 80° C. to about 150° C., about 80° C. to about 140° C., about 80° C. to about 125° C., about 80° C. to about 120° C., about 80° C. to about 110° C., about 80° C. to about 100° C., about 80° C. to about 90° C., about 90° C. to about 200° C., about 90° C. to about 180° C., about 90° C. to about 160° C., about 90° C. to about 150° C., about 90° C. to about 140° C., about 90° C. to about 125° C., about 90° C. to about 120° C., about 90° C. to about 110° C., about 90° C. to about 100° C., about 100° C. to about 200° C., about 100° C. to about 180° C., about 100° C. to about 160° C., about 100° C. to about 150° C., about 100° C. to about 140° C., about 100° C. to about 125° C., about 100° C. to about 120° C., about 100° C. to about 110° C., about 110° C. to about 200° C., about 110° C. to about 180° C., about 110° C. to about 160° C., about 110° C. to about 150° C., about 110° C. to about 140° C., about 110° C. to about 125° C., about 110° C. to about 120° C., about 120° C. to about 200° C., about 120° C. to about 180° C., about 120° C. to about 160° C., about 120° C. to about 150° C., about 130° C. to about 200° C., about 130° C. to about 180° C., about 130° C. to about 160° C., about 130° C. to about 150° C., about 150° C. to about 200° C., about 150° C. to about 180° C., about 150° C. to about 160° C., about 160° C. to about 200° C., about 80° C., about 90° C., about 100° C., about 110° C., about 120° C., about 125° C., about 130° C., about 140° C., about 150° C., about 160° C., about 180° C., or about 200° C.

In some embodiments, wherein the initiating comprises increasing a temperature of at least one of the stamp, the etch paste, the substrate, or combinations thereof by about 20° C. to about 400° C., about 20° C. to about 375° C., about 20° C. to about 350° C., about 20° C. to about 325° C., about 20° C. to about 300° C., about 20° C. to about 275° C., about 20° C. to about 250° C., about 20° C. to about 225° C., about 20° C. to about 200° C., about 20° C. to about 175° C., about 20° C. to about 150° C., about 20° C. to about 125° C., about 20° C. to about 100° C., about 20° C. to about 90° C., about 20° C. to about 80° C., about 20° C. to about 70° C., about 20° C. to about 60° C., about 20° C. to about 50° C., about 20° C. to about 40° C., about 30° C. to about 400° C., about 30° C. to about 375° C., about 30° C. to about 350° C., about 30° C. to about 325° C., about 30° C. to about 300° C., about 30° C. to about 275° C., about 30° C. to about 250° C., about 30° C. to about 225° C., about 30° C. to about 200° C., about 30° C. to about 180° C., about 30° C. to about 170° C., about 30° C. to about 160° C., about 30° C. to about 150° C., about 30° C. to about 125° C., about 30° C. to about 100° C., about 30° C. to about 90° C., about 30° C. to about 80° C., about 30° C. to about 70° C., about 30° C. to about 60° C., about 30° C. to about 50° C., about 40° C. to about 400° C., about 40° C. to about 375° C., about 40° C. to about 350° C., about 40° C. to about 325° C., about 40° C. to about 300° C., about 40° C. to about 275° C., about 40° C. to about 250° C., about 40° C. to about 225° C., about 40° C. to about 200° C., about 40° C. to about 175° C., about 40° C. to about 150° C., about 40° C. to about 125° C., about 40° C. to about 100° C., about 40° C. to about 90° C., about 40° C. to about 80° C., about 40° C. to about 70° C., about 40° C. to about 60° C., about 50° C. to about 400° C., about 50° C. to about 375° C., about 50° C. to about 350° C., about 50° C. to about 325° C., about 50° C. to about 300° C., about 50° C. to about 275° C., about 50° C. to about 250° C., about 50° C. to about 225° C., about 50° C. to about 200° C., about 50° C. to about 175° C., about 50° C. to about 150° C., about 50° C. to about 125° C., about 50° C. to about 100° C., about 50° C. to about 90° C., about 50° C. to about 80° C., about 50° C. to about 70° C., about 75° C. to about 400° C., about 75° C. to about 375° C., about 75° C. to about 350° C., about 75° C. to about 325° C., about 75° C. to about 300° C., about 75° C. to about 275° C., about 75° C. to about 250° C., about 75° C. to about 225° C., about 75° C. to about 200° C., about 75° C. to about 175° C., about 75° C. to about 150° C., about 75° C. to about 125° C., about 70° C. to about 100° C., about 75° C. to about 90° C., about 100° C. to about 400° C., about 100° C. to about 375° C., about 100° C. to about 350° C., about 100° C. to about 325° C., about 100° C. to about 300° C., about 100° C. to about 275° C., about 100° C. to about 250° C., about 100° C. to about 200° C., about 100° C. to about 175° C., about 100° C. to about 150° C., about 100° C. to about 125° C., about 125° C. to about 400° C., about 125° C. to about 375° C., about 125° C. to about 350° C., about 125° C. to about 325° C., about 125° C. to about 300° C., about 125° C. to about 275° C., about 125° C. to about 250° C., about 125° C. to about 200° C., about 125° C. to about 175° C., about 125° C. to about 150° C., about 150° C. to about 400° C., about 150° C. to about 375° C., about 150° C. to about 350° C., about 150° C. to about 325° C., about 150° C. to about 300° C., about 150° C. to about 275° C., about 150° C. to about 250° C., about 150° C. to about 225° C., about 150° C. to about 200° C., about 150° C. to about 175° C., about 200° C. to about 400° C., about 200° C. to about 375° C., about 200° C. to about 350° C., about 200° C. to about 300° C., about 200° C. to about 250° C., about 250° C. to about 400° C., about 250° C. to about 350° C., about 250° C. to about 300° C., or about 300° C. to about 400° C.

Thus, in some embodiments the present invention comprises thermally initiating a reaction between a paste and a substrate by heating at least one of the stamp, the substrate, the etch paste, or a combination thereof from a first temperature at which a reaction between a paste and a substrate does not substantially occur to a second temperature at which a reaction between a paste and a substrate readily occurs. In some embodiments, a thermal initiation step is achieved by actively cooling a stamp, an etch paste, a substrate, or a combination thereof followed by actively or passively heating to an ambient temperature, or higher. In some embodiments, a thermal initiation step is achieved by maintaining a stamp, an etch paste, a substrate, or a combination thereof at ambient temperature followed by actively heating to an elevated temperature.

In some embodiments, the paste compositions for use with the present invention are formulated to minimize the reaction of the paste in a lateral dimension of a surface (i.e., to minimize undercut). Not being bound by any particular theory, undercut can be minimized by employing a light-activated paste (i.e., a paste that reacts with a surface upon exposure to radiation) and/or a heat-activated paste. For example, an etching paste is applied to a glass surface that is transparent to UV light. Illumination of a paste through a backside of an optically transparent substrate initiates a reaction between the paste and the surface. Because the light illuminates only the surface of the paste reacting vertically with the surface, paste along the sidewalls of a subtractive surface feature is not exposed to ultraviolet light, thereby minimizing lateral etching of the surface. This technique is generally applicable to any reaction initiator that can be directed at the surface. In some embodiments, the reaction initiator can activate a paste through the backside of a stamp or elastomeric stencil.

Undercut can also be minimized by the use of a substrate having an anisotropic composition or structure, such that etching in the vertical direction is preferred compared to etching in a lateral dimension. Some materials are naturally anisotropic, while anisotropy can also be introduced by, for example, pre-treating a substrate with a chemical or radiation, and combinations thereof.

In some embodiments, a stamp or elastomeric stencil is removed from a substrate before reacting the paste. In some embodiments, a stamp or elastomeric stencil is removed from a substrate after reacting the paste.

In some embodiments, a method of the present invention further comprises: exposing an area of a substrate adjacent to a surface feature to a reactive component that reacts with the adjacent surface area, but which is unreactive towards the surface feature. For example, after producing a surface feature comprising a masking component, the substrate can be exposed to an etchant, such as a gaseous etchant, a liquid etchant, and combinations thereof.

In some embodiments, prior to applying a paste to a substrate, the substrate is patterned using a micro-contact printing method. For example, an ink can be applied to an elastomeric stamp having at least one indentation in the surface of the elastomeric stamp which defines a pattern, to form a coated elastomeric stamp, and the coated stamp is contacted with a substrate. The ink is transferred from the surface of the coated elastomeric stamp to the substrate in a pattern on the substrate defined by the pattern in the surface of the elastomeric stamp. The ink adheres to the surface, and can form at least one of a thin film, a monolayer, a bilayer, a self-assembled monolayer, and combinations thereof. In some embodiments the ink can react with the substrate. A paste is then applied to the substrate, wherein the paste is reactive towards either one of the exposed areas of the substrate or the areas of the substrate covered by the ink pattern. screen printing, ink jet printing, syringe deposition, spraying, spin coating, brushing, and combinations thereof, and other application methods known to persons of ordinary skill in the art of coating surfaces. After reacting the paste, any residual paste and/or ink on the substrate can be removed. The resulting patterned substrate comprises a pattern having lateral dimensions that are determined by the pattern in the surface of the elastomeric stamp used to apply the ink to the substrate, as well as any patterns transferred to the substrate during the paste deposition process.

In some embodiments, a method of the present invention further comprises cleaning a patterned substrate. As used herein, "cleaning" refers to a process by which any paste, debris, reagents, side-products, and the like, and combinations thereof are removed from a substrate. Cleaning processes suitable for use with the present invention include, but are not limited to, rinsing with a solvent (e.g., water, an alcohol such as ethanol, methanol and the like, a ketone such as acetone and the like); exposing the patterned substrate to a flowing gas such as nitrogen, clean dry air, and the like; placing the patterned substrate in a reactive environment (e.g., a plasma, a chemical bath, and the like); exposing the patterned substrate to electromagnetic radiation, and the like, and combinations thereof. In some preferred embodiments, cleaning comprises rinsing a patterned substrate with water.

Having generally described the invention, a further understanding can be obtained by reference to the examples provided herein. These examples are given for purposes of illustration only and are not intended to be limiting.

EXAMPLES

Example 1

An etching paste was prepared by adding a thickener (sodium carboxymethylcellulose, 1 g) to an 85% aqueous solution of $H_3PO_4$ (10 mL) with vigorous stirring (~400 rpm), and the resulting mixture was vigorously stirred an additional 20-30 minutes.

The paste was poured onto an elastomeric stamp having indentations defining a pattern in the surface of the elastomeric stamp. The surface of the stamp was doctor bladed with a glass slide to ensure the indentations were filled uniformly with paste and to remove excess paste from the surface of the elastomeric stamp. The elastomeric stamp was then contacted with an aluminum surface, and the paste reacted with the surface for 5 minutes at room temperature. The stamp was then removed from the aluminum surface, and the surface was rinsed with deionized water and dried. Subtractive non-penetrating features were formed on the surface having lateral dimensions defined by the pattern in the surface of the elastomeric stamp.

Example 2

The etching paste prepared in Example 1 is applied to a stamp having indentations defining a pattern by spin-coating (at about 100 rpm to about 5,000 rpm). The coated stamp is then contacted with an aluminum surface and the paste reacts for 5 minutes at room temperature. The stamp is removed from the aluminum surface, and the surface is rinsed with deionized water and dried. Subtractive non-penetrating features are formed on the aluminum surface having lateral dimensions defined by the pattern in the surface of the stamp.

Example 3

An elastomeric stencil having openings defining a pattern is conformally contacted with an aluminum surface. The etching paste prepared in Example 1 is applied to the openings in the elastomeric stencil, and reacts with the aluminum surface for 5 minutes at room temperature. The elastomeric stencil is then removed from the aluminum surface, and the surface is rinsed with deionized water and dried. Subtractive non-penetrating surface features are formed on the aluminum surface having lateral dimensions defined by the lateral dimensions of the openings in the elastomeric stencil.

Example 4

An elastomeric stencil having openings with lateral dimensions of 50 μm was conformally contacted with an ITO-on-glass surface (ITO thickness=30 nm). The etching paste prepared in Example 1 was applied to the openings in the elastomeric stencil. The paste was reacted with the ITO for 5 minutes at room temperature. The elastomeric stencil was then removed from the ITO-on-glass surface, and the surface was rinsed with deionized water and dried. Subtractive non-penetrating surface features were formed in the ITO, and are displayed in FIGS. 5-7.

Figure 5:
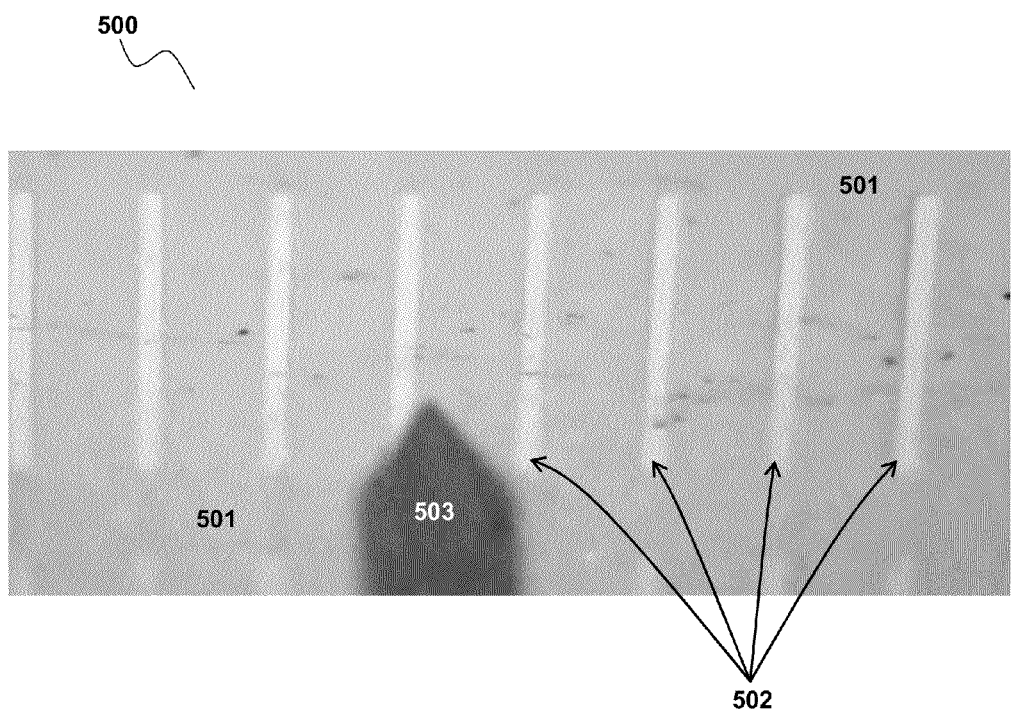
FIG. 5 provides an image of an indium tin oxide (ITO, thickness=30 nm) on glass ($SiO_2$) substrate having subtractive non-penetrating surface features produced by a method of the present invention, as described in Example 4.

Referring to FIG. 5, a visible microscopy image, 500, is provided of an ITO-on-glass substrate, 501, having a pattern of features thereon, 502. The surface features, 502, are rectangular trenches having lateral dimensions of about 80 μm by about 1.5 mm, and having a depth of about 30 nm. The dark image, 502, in the upper half of FIG. 5 is a profilometer probe, a reflection of which, 503, appears in the bottom half of the FIG. 5.

Figure 6:
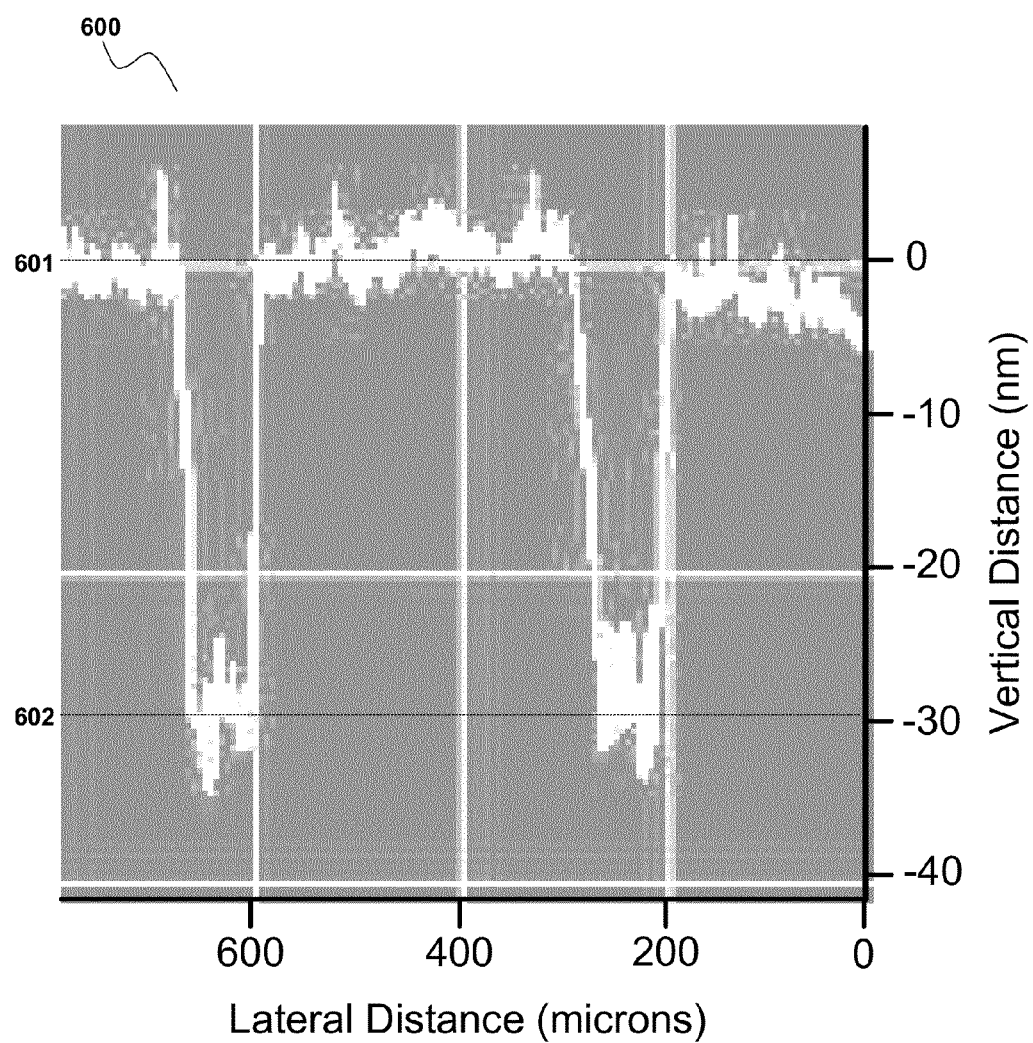
FIG. 6 provides a graphical representation of an elevation profile of the subtractive non-penetrating features on a glass slide, as shown in FIG. 5.

Referring to FIG. 6, a graphical representation of an elevation profile of the subtractive non-penetrating features on a glass slide, as shown in FIG. 5. The elevation profile was measured by scanning profilometry. The image shows that the distance between lines 601 and 602 is approximately 30 nm.

Referring to FIG. 7, a graphical representation, 700, of a lateral profile determined by optical profilometry of the subtractive non-penetrating features on an ITO-on-glass substrate, as shown in FIG. 5, is provided. The lateral profile shows the lateral dimensions of the surface features (as determined by the distance between lines 701 and 704) is about 80 μm. The indentations in the elastomeric stamp used to apply the paste to the substrate comprised indentations having lateral dimensions of about 50 μm. The lateral dimension of surface features at their deepest penetration into the substrate (as determined by the distance between lines 702 and 703) is about 60 μm. The portion of the surface feature between lines

701 and 702, and between lines 703 and 704, respectively, refers the undercut of the surface feature, which is about 10 µm.

Example 5

An etching paste was prepared by dissolving potassium hydroxide (8 g) in deionized water (25 mL). A thickener (sodium carboxymethylcellulose, 2 g) was added with vigorous stirring (~400 rpm), and the resulting mixture was stirred an additional 20-30 minutes.

The paste was poured onto an elastomeric stamp having indentations defining a pattern in the surface of the stamp. The surface of the stamp was doctor bladed to ensure the indentations were filled uniformly with paste and to remove excess paste from the surface of the elastomeric stamp. The elastomeric stamp was then contacted with a silicon surface and the paste reacted with the surface for 15 minutes at elevated temperature (100° C.). The stamp was then removed from the silicon surface, and the surface was rinsed with deionized water and dried. Subtractive non-penetrating features were formed on the surface having lateral dimensions defined by the pattern in the surface of the elastomeric stamp.

Example 6

The etching paste prepared in Example 5 is applied to a stamp having indentations defining a pattern by spin-coating (at about 100 rpm to about 5,000 rpm). The coated stamp is then contacted with a silicon surface and the paste reacts for 5 minutes at room temperature. The stamp is removed from the silicon surface, and the surface is rinsed with deionized water and dried. Subtractive non-penetrating features are formed on the silicon surface having lateral dimensions defined by the pattern in the surface of the elastomeric stamp.

Example 7

An elastomeric stencil having openings defining a pattern is conformally contacted with a silicon surface. The etching paste prepared in Example 5 is applied to the openings in the elastomeric stencil, and reacts with the silicon surface for 5 minutes at room temperature. The elastomeric stencil is then removed from the silicon surface, and the surface is rinsed with deionized water and dried. Subtractive non-penetrating surface features are formed in the silicon surface having lateral dimensions defined by the lateral dimensions of the openings in the elastomeric stencil.

Example 8

An elastomeric stencil having openings with lateral dimensions of 50 µm was pre-treated by exposure to an atmospheric plasma (approximately 78% $N_2$, 21% $O_2$ and 1% Ar) for 30 seconds (PDC-32G tabletop plasma cleaner, Harrick Plasma, Ithaca, N.Y.), which made the surface of the stamp hydrophilic. The pre-treated elastomeric stencil was conformally contacted with the surface of a glass microscope slide. An etching paste (ETCHALL®, B&B Products, Inc., Peoria, Ariz.) was diluted with deionized water (1:1 by volume), and then applied to the openings in the elastomeric stencil. The paste was reacted with the glass surface for 1 minute at room temperature. The elastomeric stencil was then removed from the glass surface, and the surface was rinsed with deionized water and dried. Subtractive non-penetrating surface features were formed in the glass surface, and are displayed in FIG. 8-10.

Referring to FIG. 8, an image, 800, of a glass ($SiO_2$) substrate, 801, having subtractive non-penetrating surface features thereon, 802, produced by a method of the present invention is provided. The surface features are rectangular trenches having lateral dimensions of about 150 µm by about 0.5 mm, and having a depth of about 6.8 µm. The dark image in the upper portion of FIG. 8, 803, is a profilometer probe, a reflection off the substrate of which, 804, can be seen in the bottom half of the image.

Referring to FIG. 9, a graphical representation, 900, the elevation profile of the subtractive non-penetrating features on a glass ($SiO_2$) substrate, as shown in FIG. 8, is provided. The elevation profile was measured by scanning profilometry. The image, 900, shows that the penetration distance between the surface of the substrate, 901, and the bottom of the surface features, 902, is approximately 6.8 µm.

Referring to FIG. 10, a graphical representation, 1000, of a lateral profile of the subtractive non-penetrating features on a glass slide, as shown in FIG. 8, as determined by optical profilometry. The lateral profile shows the lateral dimensions of the surface features (as determined by the distance between lines 1001 and 1004) is about 150 µm. The indentations in the elastomeric stamp used to apply the paste to the surface had indentations with lateral dimensions of about 50 µm. The lateral dimension of the base of the surface features (as determined by the distance between lines 1002 and 1003) is about 50 µm. The portion of the surface feature between lines 1001 and 1002 and between lines 1003 and 1004, respectively, is the undercut of the surface feature, which is about 50 µm.

Example 9

A conductive paste is prepared by vigorously mixing silver particles (40% by weight) and a thickener (polyethylene oxide, 5% by weight) in water.

An elastomeric stencil having openings defining a pattern is conformally contacted with a glass ($SiO_2$) surface. The conductive paste is applied to the openings in the elastomeric stencil, and reacts with the glass surface for 2 minutes at elevated temperature (300° C.). The elastomeric stencil is then removed from the glass surface, and the surface is rinsed with deionized water and dried. Additive non-penetrating conductive surface features comprising silver are formed on the glass surface having lateral dimensions defined by the lateral dimensions of the openings in the elastomeric stencil.

Example 10

A reactive paste comprising silica glass particles ($SiO_2$, 15% by weight), phosphoric acid (10% by weight), a thickener (polyvinylpyrrolidone, 5% by weight) and water is prepared by vigorously mixing the components.

The reactive paste is spin-coated onto a silicon surface (a silicon wafer). An elastomeric stamp having indentations defining a pattern in the surface of the stamp is pre-treated by exposing it to tridecafluoro-1,1,2,2-tetrahydrooctyltrichlorosilane to functionalize the surface of the stamp with fluorocarbon groups. This surface of the elastomeric stamp is contacted with the silicon surface and sufficient pressure or vacuum is applied to the backsides of the surface and the stamp to remove paste from between the surfaces of the stamp and the silicon that are contacting one another. Paste is present in the indentations of the stamp. The paste is then dried by heating the substrate (100° C.) for 10 minutes. The elastomeric stamp is then removed from the silicon surface, and the paste is reacted by heating the silicon surface (950° C.) for 20 minutes. The surface is cooled, and the paste is rinsed from the surface with water and sonication. Conformal penetrating semiconductive features (silicon n-doped with phosphorous) are formed on the silicon surface having lateral dimensions defined by the pattern in the elastomeric stamp.

Example 11

A PDMS elastomeric stamp is exposed to an atmospheric plasma (approximately 78% $N_2$, 21% $O_2$ and 1% Ar) to make its surface hydrophilic. A reactive paste comprising silver nitrate (1.7 g), sodium carboxymethyl cellulose (8 g) and deionized water (100 mL) is poured onto the elastomeric stamp, and then doctor bladed to fill the indentations that define a pattern in the surface of the stamp, and to remove any excess paste from the surface of the elastomeric stamp. The surface of the elastomeric stamp is then contacted with a copper-coated surface at room temperature for 10 min. The stamp is then removed, and the substrate is washed with deionized water and dried. Conformal penetrating silver features are formed on the copper surface in the same pattern as that of the indentations in the elastomeric stamp.

Example 12

A PDMS elastomeric stamp having indentations that define a pattern in its surface is exposed to an atmospheric plasma (approximately 78% $N_2$, 21% $O_2$ and 1% Ar) to make the surface of the elastomeric stamp hydrophilic. An paste comprising silicon dioxide particles (10% by weight) and a thickener (polylactic acid, 5% by weight) in water is poured onto the surface of the elastomeric stamp, and then doctor bladed to uniformly fill the indentations and remove any excess paste from the surface of the elastomeric stamp. The surface of the elastomeric stamp is then contacted with a metal surface. The metal surface is heated (~100° C.) for 5 minutes, and the stamp is then removed from the metal surface. The $SiO_2$ features produced on the metal surface have lateral dimensions equivalent to the dimension of the indentations in the surface of the elastomeric stamp. The surface features can function, for example, as a mask for etching the metal surface, and/or as an insulating pattern on the metal surface.

Example 13

A first etching paste suitable for producing subtractive features in a gold surface is prepared by mixing 4 g KI, 1 g $I_2$ and 40 mL $H_2O$ with a 1 g of a thickener and mixing vigorously for 20-30 minutes. A second etching paste suitable for producing subtractive features in a gold surface is prepared by mixing 100 mL of an aqueous solution containing $K_3Fe(CN)_6$, (4 M), KCN (0.2 M) and KOH (0.1 M) with a thickener (1 g). The solution is mixed vigorously for 20-30 minutes.

An ink (hexadecane thiol) is coated onto the surface of an elastomeric stamp having an indentation that defines a pattern in its surface. The ink is dried, and the coated stamp is conformally contacted with a gold surface. The stamp is removed from the gold surface and a self-assembled monolayer of the hexadecane thiol is produced on the areas of the surface that are in conformal contact with the elastomeric stamp. Either the first or second etching paste prepared above is applied to the gold surface and reacted at room temperature for 10 minutes. The surface is then rinsed to remove the paste from the surface. Subtractive non-penetrating features are produced on the areas of the surface not covered by the self assembled monolayer.

Example 14

Figure 11A:
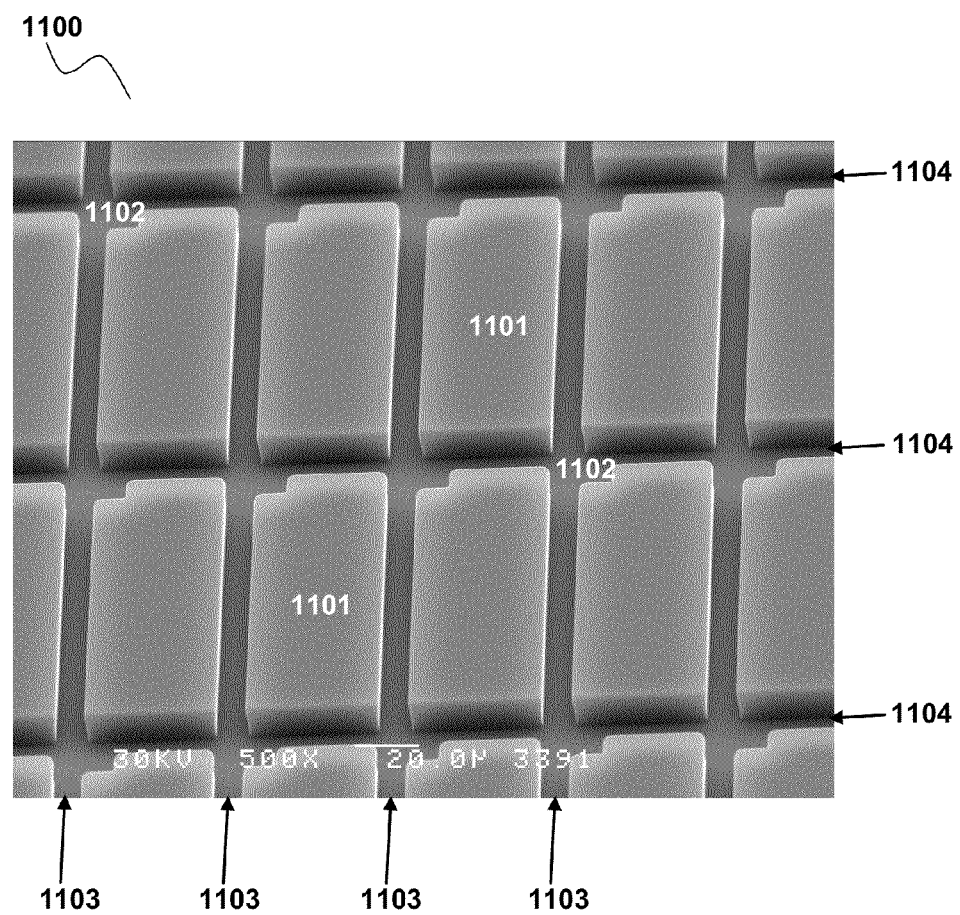
FIG. 11A provides a scanning electron micrograph ("SEM") of a stamp of the present invention.

A stamp having a surface that included a series of interlocking channels having lateral dimensions of about 10 µm and 20 µm was prepared. FIG. 11A provides a scanning electron micrograph ("SEM") image, 1100, of the stamp surface. Referring to FIG. 11A, the stamp surface, 1101, includes a continuous indentation, 1102, comprising interlocking channels, 1103 and 1104, having a lateral dimension of about 10 µm and 20 µm, respectively.

The surface of the stamp and the indentations of the stamp were pre-treated by exposure to an oxygen plasma for about 2 minutes using a Harrick PDC-001 RF-generated oxygen plasma tool operated at 30 W (Harrick Plasma, Ithaca, N.Y.).

An etch paste comprising phosphoric acid and poly-N-vinylpyrrolidone, and having a viscosity of about 250 cP was applied to the pre-treated PDMS stamp. The coated stamp was contacted with an ITO-on-glass substrate (ITO thickness of 150 nm over glass), and a pressure of about 50 kPa was evenly applied to the backside of the stamp. After the stamp was contacted with the substrate for about 30 seconds, the substrate and stamp were placed on a 130° C. hot plate for 5 minutes. Thus, a reaction between the paste and the substrate was initiated by increasing the temperature of the substrate and the paste by about 100° C. After 5 minutes the substrate was removed from the hot plate, the stamp was removed from the substrate, and the substrate was cleaned by rinsing with deionized water, and then dried.

Figure 11B:
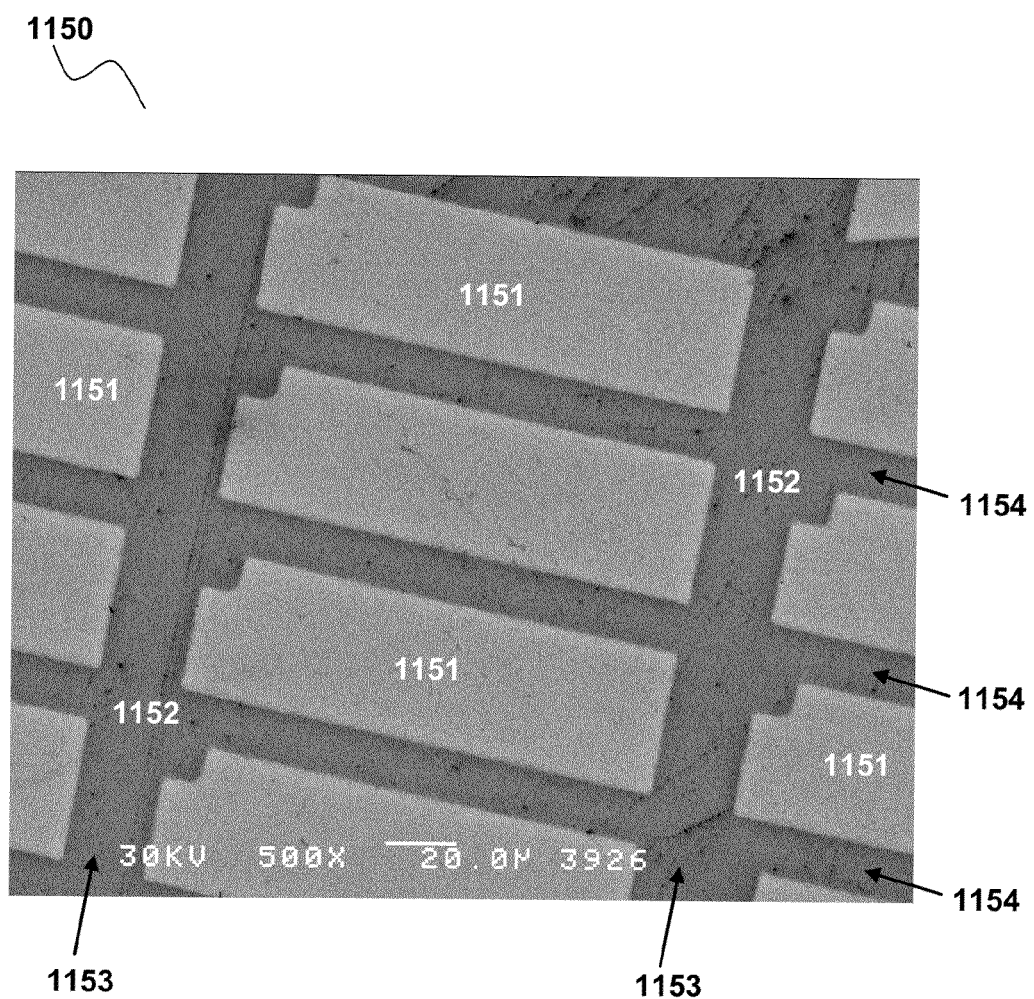
FIG. 11B provides a SEM image of a patterned substrate (ITO-on-glass) prepared by a method of the present invention, as described in Example 14.

FIG. 11B provides a SEM image, 1150, of the patterned substrate. Referring to FIG. 11B, the substrate surface, 1151, includes a continuous subtractive feature, 1152, that includes a series of interlocking channels, 1153 and 1154, having a lateral dimension of about 10 µm and 20 µm, respectively. Thus, the lateral dimensions of the at least one indentation in the surface of the stamp was replicated on the ITO substrate. The at least one indentation in the surface of the stamp corresponded to the etched regions in the ITO substrate in a 1:1 manner.

Comparative Example A

The pressure applied to the backside of the stamp was varied. Specifically, the patterning process provided in Example 14 was repeated without pressure (i.e., 0 kPa), a pressure of about 100 kPa, a pressure of about 200 kPa, and a pressure of about 400 kPa applied to the backside of the stamp during the contacting and reacting.

In the case of no pressure applied to the backside of the stamp, the ITO-on-glass substrate was etched uniformly during the reacting. Thus, pressure should be applied to the backside of the stamp in order to confine the paste in a volume provided by the at least one indentation during the contacting and reacting.

Application of a pressure of about 400 kPa to the backside of the stamp during the contacting and reacting resulted in deformation of the stamp during the contacting and reacting. This provided surface features having variable lateral dimensions and uneven etching. Thus, in some embodiments a pressure not exceeding a maximum pressure should be applied to the backside of the stamp in order to confine the paste in a volume provided by the at least one indentation during the contacting and reacting, but not distort the lateral dimensions of the pattern in the surface of a stamp.

Application of a pressure of about 100 kPa or about 200 kPa applied evenly to the backside of the stamp during the contacting or reacting resulted in patterning of the ITO-on-glass substrate that was substantially identical to that provided in Example 14. Thus, a pressure of about 50 kPa to about 300 kPa is sufficient to provide repeatable patterning of ITO-on-glass using an etch paste that contained phosphoric acid.

Comparative Example B

The patterning process provided in Example 14 was repeated using etch pastes comprising phosphoric acid and having a viscosity of about 5 cP, a viscosity of about 5,000 cP, and a viscosity of about 30,000 cP. The pastes were HIP-ERETCH® phosphoric acid-containing etch pastes (available from Merck KGaA, Darmstadt, Germany).

For the etch paste having a viscosity of about 5 cP, the ITO-on-glass substrate was etched uniformly during the reacting such that no pattern was apparent in the ITO surface layer. All attempts to pattern an ITO-on-glass substrate using an etch paste having a viscosity <20 cP resulted in an etching reactions that failed to produce surface features. Thus, in some embodiments a minimum viscosity of a paste is required in order to confine the paste in a volume provided by the at least one indentation during the contacting and reacting.

For the etch pastes having a viscosity of about 5,000 cP and about 30,000 cP, the ITO-on-glass substrate was not substantially etched or etched unevenly during the reacting. Thus, in some embodiments a paste having a viscosity exceeding a maximum value is insufficient to react and/or uniformly react the paste with a substrate.

Comparative Example C

The patterning process provided in Example 14 was repeated except the temperature of the hot plate was 100° C. After 5 minutes, no reacting of the ITO-on-glass substrate was observed. Thus, in some embodiments a minimum temperature is required in order to catalyze the reacting of a paste with a substrate.

Comparative Example D

The patterning process provided in Example 14 was repeated except the pre-treatment conditions used to prepare the stamp surface were omitted or varied. The following pre-treatment conditions were examined, as listed in the following Table.

TABLE

| Pre-Treatment Condition | Result |
| --- | --- |
| None (unmodified PDMS) | Uneven patterning |
| Oxygen Plasma (uniformly applied, as in Example 14) | Full resolution of surface features |
| Fluorinated SAM (uniformly applied) | No patterning or uneven patterning |
| Hydrophobic SAM (uniformly applied) | Uneven patterning |
| Hydrophilic SAM (uniformly applied) | Uneven patterning |

Referring to the above Table, in addition to no pre-treatment and exposure to an oxygen plasma, stamps were also derivatized using self-assembled monolayer-forming species (SAM-forming species). SAM-derivatization was performed by chemical vapor depositing a SAM-forming species onto a surface of an oxygen plasma-treated stamp. The SAM-forming species were: trichloro(perfluorooctyl)silane (fluorinated SAM), trichloro(octadecyl)silane (hydrophobic SAM), and aminopropyl-trimethoxysilane (hydrophilic SAM). Surprisingly, only pre-treatment with an oxygen plasma provided reproducible patterning using an etch paste that contained phosphoric acid.

Example 15

Large-area surface features were patterned on an ITO-on-glass substrate by a process of the present invention. A stamp was prepared in which areas of the stamp surface having lateral dimensions of 7 mm×20 mm were separated by indentations having a width of 100 µm and 1 mm (in the x- and y-directions, respectively). The stamp had a total area of about 40 cm by about 40 cm. In the indentations that had a width of about 1 mm, the stamp also included channels having a width of about 20 µm and a length of about 18 mm.

The stamp (both the surface and the indentations) was pre-treated with an oxygen plasma (as in Example 14) and a phosphoric acid-containing etch paste (HIPERETCH™, Merck KGaA, Darmstadt, Germany) was applied substantially uniformly to the stamp surface. The coated stamp was then contacted with an ITO-on-glass substrate, and a pressure of about 100 kPa was applied substantially evenly to the backside of the stamp. Upon contacting the coated stamp with the substrate, excess etch paste was substantially removed from between the stamp surface and the substrate and flowed from the indentations into the channels, and onto the backside of the stamp. After conformally contacting the coated stamp with the substrate for about 30 seconds, a reaction between the etch paste and the ITO was initiated by placing the substrate on a hot plate at a temperature of about 130° C. for about 5 minutes. Thus, a reaction between the paste and the substrate was initiated by increasing the temperature of the substrate and the paste by about 100° C. After the reacting, the substrate was removed from the hot plate, the stamp was removed from the substrate, and the substrate was cleaned by rinsing with water. The resulting pattern on the substrate consisted of ITO islands having a lateral dimension of about 7 mm by about 20 mm, separated by channels in a first direction having a width of about 100 µm, and separated by channels in a second direction having a width of about 1 mm.

Comparative Example E

An attempt was made to pattern large-area surface features on an ITO-on-glass substrate by the process described in Example 15, except a stamp lacking channels was utilized for the patterning. The stamp was pre-treated, coated, and conformally contacted with a substrate as in Example 15. However, when the reacting was initiated, paste remained between the surface of the stamp and the substrate, which resulted in unconfined etching of the ITO layer, and poor surface feature resolution. The resulting pattern was poorly resolved and uneven. Thus, the patterning of large-area surface features (i.e., having a lateral dimension of about 1 mm or greater), or even smaller surface features that are separated by a large distance (i.e., separated by a distance of about 1 mm or more), requires the use of a stamp having channels in the indentations of the stamp to form reproducible and consistent patterns.

Example 16

A substrate (ITO-on-glass) was patterned in a single process with a surface features that included at least one lateral dimension of about 1 µm to about 25 µm and a second group of features having at least one lateral dimension of about 100 µm or greater. An elastomeric stamp was prepared (using SYLGARD® 184, Dow Corning Corp., Midland, Mich.), wherein the stamp surface included a pattern of indentations comprising a central channel having a lateral dimension of about 100 µm, as well as areas of parallel channels peripheral to the central channel. The channels in the peripheral regions had lateral dimensions of about 20 µm and about 10 µm, respectively. The 100 µm-wide indentation included a drain channel having a width of about 20 µm, which was present over the length of the channel.

The stamp was pre-treated with an oxygen plasma (as in Example 14) and a phosphoric acid-containing etch paste (HIPERETCH®, Merck KGaA, Darmstadt, Germany) was applied substantially uniformly to the stamp surface. The coated stamp was then contacted with an ITO-on-glass substrate, and a pressure of about 100 kPa was applied substantially evenly to the backside of the stamp. Upon contacting the coated stamp with the substrate, excess etch paste was substantially removed from between the stamp surface and the substrate and flowed from the indentations into the channel. After conformally contacting the coated stamp with the substrate for about 30 seconds, a reaction between the etch paste and the ITO was initiated by placing the substrate on a hot plate at a temperature of about 130° C. for about 5 minutes. Thus, a reaction between the paste and the substrate was initiated by increasing the temperature of the substrate and the paste by about 100° C. After the reacting, the substrate was removed from the hot plate, the stamp was removed from the substrate, and the substrate was cleaned by rinsing with water. The resulting pattern subtractive non-penetrating surface features (channels) in the ITO surface layer. Channels having a lateral dimension of about 10 µm, 20 µm and 100 µm were created in the ITO-on-glass substrate using a single patterning process.

Figure 12:
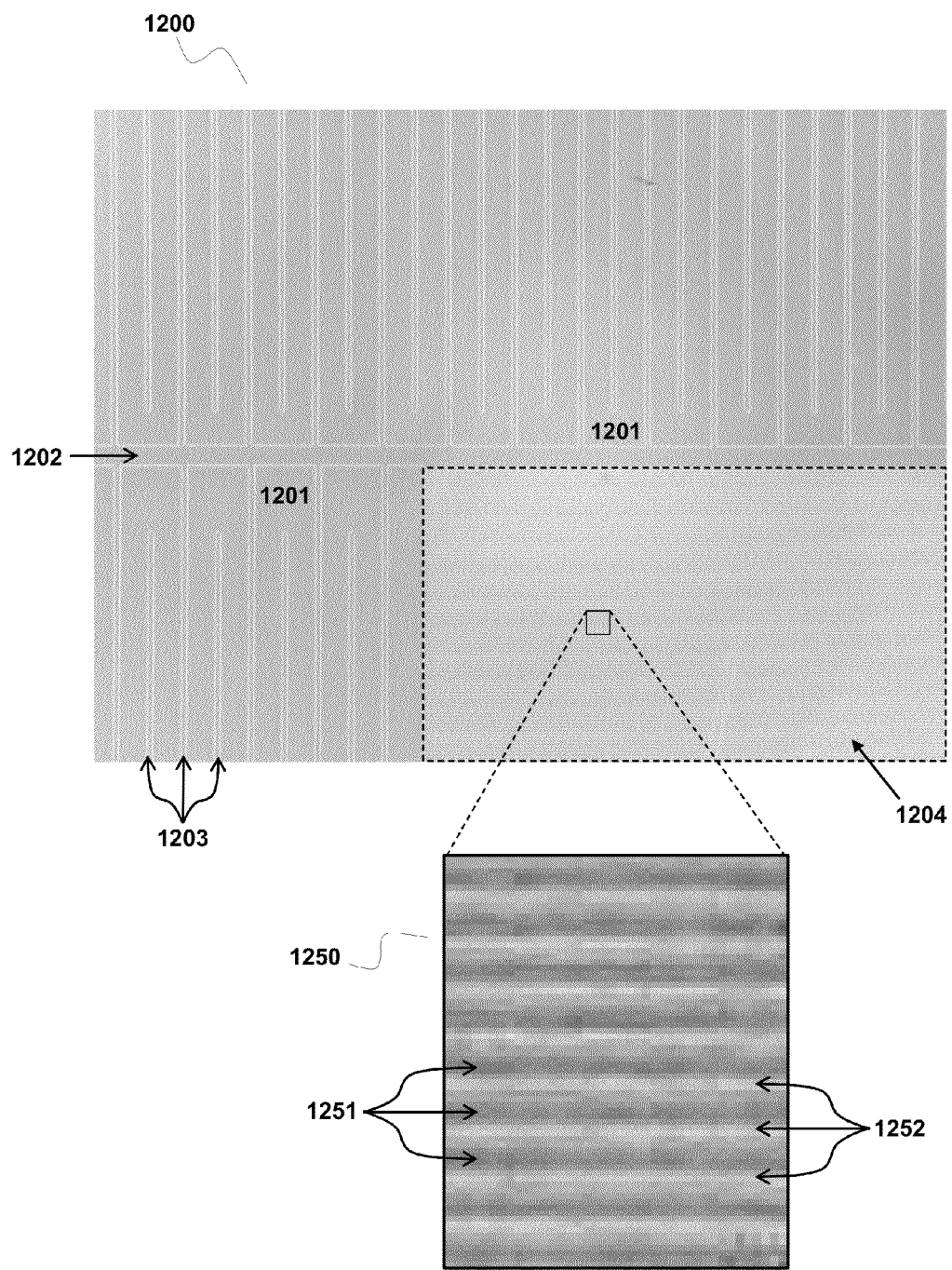
FIG. 12 provides an optical microscope image of a patterned substrate (ITO-on-glass) prepared by a method of the present invention, as described in Example 16.

FIG. 12 provides an optical microscope image, 1200, of the patterned ITO-on-glass substrate. Referring to FIG. 12, the patterned substrate, 1201, included a central channel, 1202, having a lateral width of about 100 µm, and side channels, 1203, having a width of about 20 µm. The patterned substrate also included an area, 1204, consisting of parallel channels (subtractive non-penetrating features) having a width of about 10 µm. The inset, 1250, highlights a portion of the patterned substrate having 10 µm wide channels, 1251, separated by about 10 µm of ITO, 1252. Thus, the methods of the present invention are suitable for preparing patterned substrates that include at least one surface features having a lateral dimension of about 1 µm to about 25 µm and at least one second surface feature having a lateral dimension of about 100 µm or greater.

Example 17

An elastomeric stamp having a surface including at least one indentation therein will be prepared by the process described in, for example, U.S. Pat. No. 5,900,160, which is incorporated herein by reference. The surface of the stamp and the indentations of the stamp will be pre-treated by exposing the stamp to an oxygen plasma as described herein.

A ferric chloride-based etch paste (available from, e.g., Merck KGaA, Darmstadt, Germany) will be applied to the stamp surface. The coated stamp will be cooled to about 0° C. or less. The cooled, coated stamp will be contacted with an ITO-on-glass substrate that is cooled to a temperature of about 0° C. or less, and a pressure of about 50 kPa to about 300 kPa will be evenly applied to the backside of the stamp. After the stamp conformally contacts with the substrate for about 30 seconds, the substrate and stamp will be actively or passively heated to about 25° C., which is a temperature at which a reaction between the paste and the substrate readily occurs. Thus, a reaction between the paste and the substrate will initiated by increasing the temperature of the substrate and the paste by about 25° C. or more. After the reacting, the substrate will be cleaned by rinsing with deionized water, and then dried. The patterned substrate will comprise at least one surface feature having a lateral dimension of about 500 nm to about 50 microns.

CONCLUSION

These examples illustrate possible embodiments of the present invention. While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

All documents cited herein, including journal articles or abstracts, published or corresponding U.S. or foreign patent applications, issued or foreign patents, or any other documents, are each entirely incorporated by reference herein, including all data, tables, figures, and text presented in the cited documents.

What is claimed is:

1. A method for etching a feature into a substrate, the method comprising:
    (a) providing a stamp having a surface including at least one indentation therein, the at least one indentation being contiguous with and defining a pattern in the surface of the stamp, wherein the surface and the at least one indentation are hydrophilic;
    (b) applying an etch paste to the surface and the at least one indentation of the stamp to provide a coated stamp;
    (c) conformally contacting the surface of the coated stamp with a substrate;
    (d) applying pressure to a backside of the stamp to isolate the etch paste on an area of the substrate adjacent to the at least one indentation and substantially remove etch paste from between the surface of the stamp and the substrate; and
    (e) reacting the etch paste with the substrate for a period of time sufficient to etch a feature into the substrate having at least one lateral dimension of about 1 µm to about 25 µm and etch another feature into the substrate having at least one lateral dimension of about 100 µm or greater, wherein the reacting is isolated on an area of the substrate adjacent to the at least one indentation.

2. The method of claim 1, wherein the applying pressure comprises substantially evenly applying about 50 kPa to about 300 kPa to the backside of the stamp.

3. The method of claim 1, further comprising initiating a reaction between the etch paste and the substrate.

4. The method of claim 3, wherein the initiating comprises increasing a temperature of at least one of the stamp, the etch paste, the substrate, or combinations thereof by about 20° C. to about 400° C.

5. The method of claim 1, further comprising: after reacting the etch paste, removing the stamp from the substrate.

6. The method of claim 1, further comprising substantially uniformly pre-treating the stamp with an oxygen plasma to provide the stamp having a hydrophilic surface and indentation.

7. The method of claim 1, wherein the conformally contacting comprises a substrate that includes a layer of indium tin oxide.

8. The method of claim 7, wherein the uniformly applying includes an etch paste comprising phosphoric acid and having a viscosity of about 80 cP to about 500 cP.

9. The method of claim 1, wherein the providing includes a stamp having a surface area of about 40,000 mm$^2$ or greater.

10. The method of claim 1, Wherein the providing comprises a stamp that includes at least one indentation having a surface area of greater than 1 mm$^2$ and having a channel fluidly connecting the at least one indentation with a back surface of the stamp, wherein the channel is suitable for dissipating a trapped gas or excess etch paste from the at least one indentation.

11. A method for etching a feature into a substrate, the method comprising:
  (a) applying an etch paste to a substrate to form a coated substrate;
  (b) providing a stamp having a surface including at least one indentation therein, the at least one indentation being contiguous with and defining a pattern in the surface of the stamp, wherein the surface and the at least one indentation are hydrophilic;
  (c) conformally contacting the surface of the coated stamp with a substrate;
  (d) applying pressure to a backside of the stamp to isolate the etch paste on an area of the substrate adjacent to the at least one indentation and substantially remove etch paste from between the surface of the stamp and the substrate; and
  (e) reacting the etch paste with the substrate for a period of time sufficient to etch a feature into the substrate having at least one lateral dimension of about 1 μm to about 25 μm and etch another feature into the substrate having at least one lateral dimension of about 100 μm or greater, wherein the reacting is isolated on an area of the substrate adjacent to the at least one indentation.

12. The method of claim 11, wherein the applying an etch paste comprises uniformly applying the etch paste to the substrate.

13. The method of claim 11, further comprising initiating a reaction between the etch paste and the substrate.

14. The method of claim 13, wherein the initiating comprises increasing a temperature of at least one of the stamp, the etch paste, the substrate, or combinations thereof by about 20° C. to about 400° C.

15. The method of claim 11, wherein the applying at etch paste comprises applying the etch paste to an edge of the substrate, and wherein the conformally contacting comprises contacting the stamp first with an edge of the substrate having the etch paste thereon and gradually increasing the contact area between the stamp and the substrate until the entire stamp surface conformally contacts the substrate.

16. The method of claim 11, further comprising: after reacting the paste, removing the stamp from the substrate.

17. The method of claim 11, wherein the applying pressure comprises substantially evenly applying about 50 kPa to about 300 kPa to the backside of the stamp.

18. The method of claim 11, further comprising: after reacting the etch paste, cleaning the substrate.

19. The method of claim 11, further comprising substantially uniformly pre-treating the stamp with an oxygen plasma to provide the stamp having a hydrophilic surface and indentation.

20. The method of claim 11, wherein the conformally contacting comprises a substrate that includes a layer of indium tin oxide.

21. The method of claim 20, wherein the uniformly applying includes an etch paste comprising phosphoric acid and having a viscosity of about 80 cP to about 500 cP.

22. The method of claim 11, wherein the providing includes a stamp having a surface area of about 40,000 mm$^2$ or greater.

23. The method of claim 11, wherein the providing comprises a stamp that includes at least one indentation having a surface area of greater than 1 mm$^2$ and having a channel fluidly connecting the at least one indentation with a back surface of the stamp, wherein the channel is suitable for dissipating a trapped gas or excess etch paste from the at least one indentation.

* * * * *